(12) United States Patent
Naka et al.

(10) Patent No.: US 7,052,189 B2
(45) Date of Patent: May 30, 2006

(54) OPTICAL ELECTRONIC DEVICE

(75) Inventors: Hiroshi Naka, Komoro (JP); Masaaki Tsuchiya, Toubu (JP); Shigeo Yamashita, Machida (JP)

(73) Assignee: Renesas Technology Corporation, Tokyo (JP)

( * ) Notice: Subject to any disclaimer, the term of this patent is extended or adjusted under 35 U.S.C. 154(b) by 222 days.

(21) Appl. No.: 10/294,698

(22) Filed: Nov. 15, 2002

(65) Prior Publication Data

US 2003/0113076 A1    Jun. 19, 2003

(30) Foreign Application Priority Data

Dec. 14, 2001    (JP)    ............... 2001-381210

(51) Int. Cl.
*G02B 6/42*    (2006.01)
(52) U.S. Cl. .......................... 385/92; 385/88
(58) Field of Classification Search ............... 385/92, 385/88, 94
See application file for complete search history.

(56) References Cited

U.S. PATENT DOCUMENTS

| 5,515,469 | A  | * | 5/1996 | Zarem et al. | ................. | 385/92 |
| 6,282,352 | B1 | * | 8/2001 | Kato et al. | ..................... | 385/92 |
| 6,476,379 | B1 | * | 11/2002 | Ando et al. | ............ | 250/227.11 |
| 2003/0002825 | A1 | * | 1/2003 | Karker et al. | ................. | 385/92 |

FOREIGN PATENT DOCUMENTS

| JP | 10-307235 | | 5/1997 |
| WO | WO98/45741 | * | 10/1998 |

OTHER PUBLICATIONS

"D372-Type Digital Uncooled DFB FastLight Laser Module for 2.5 Gbits/s Applications", Lucent Technologies, Data Sheet, Dec. 2000.

* cited by examiner

Primary Examiner—Frank G. Font
Assistant Examiner—James P. Hughes
(74) Attorney, Agent, or Firm—Reed Smith LLP; Stanley P. Fisher, Esq.; Juan Carlos A. Marquez, Esq.

(57) ABSTRACT

The present invention provides an optical electronic device which includes a package casing made of plastic, a plurality of metal-made leads which extend between the inside and the outside of the package casing and form electrode terminals at external portions thereof, a lead base which is arranged in an inner bottom of the package and is integrally formed with at least one or the plurality of leads, a support substrate which is fixed onto the lead base and includes a conductive layer of a given pattern on an upper surface thereof, an optical element which is fixed onto the support substrate, an optical fiber which extends between the inside and the outside of the package casing and has an inner end thereof to face the optical element to perform transmission and reception of light between the optical fiber and the optical element, one or a plurality of electronic parts fixed to the leads in the inside of the package casing, and conductive wires which electrically connect electrodes of the optical element, electrodes of the electronic parts, the conductive layer of the support substrate and the leads to each other when necessary, wherein the electronic part includes one or a plurality of upper electrodes on an upper surface thereof and the upper electrodes are connected to other conductive portions through conductive wires. Due to such a constitution, the reliability of mounting electronic parts can be enhanced.

22 Claims, 26 Drawing Sheets

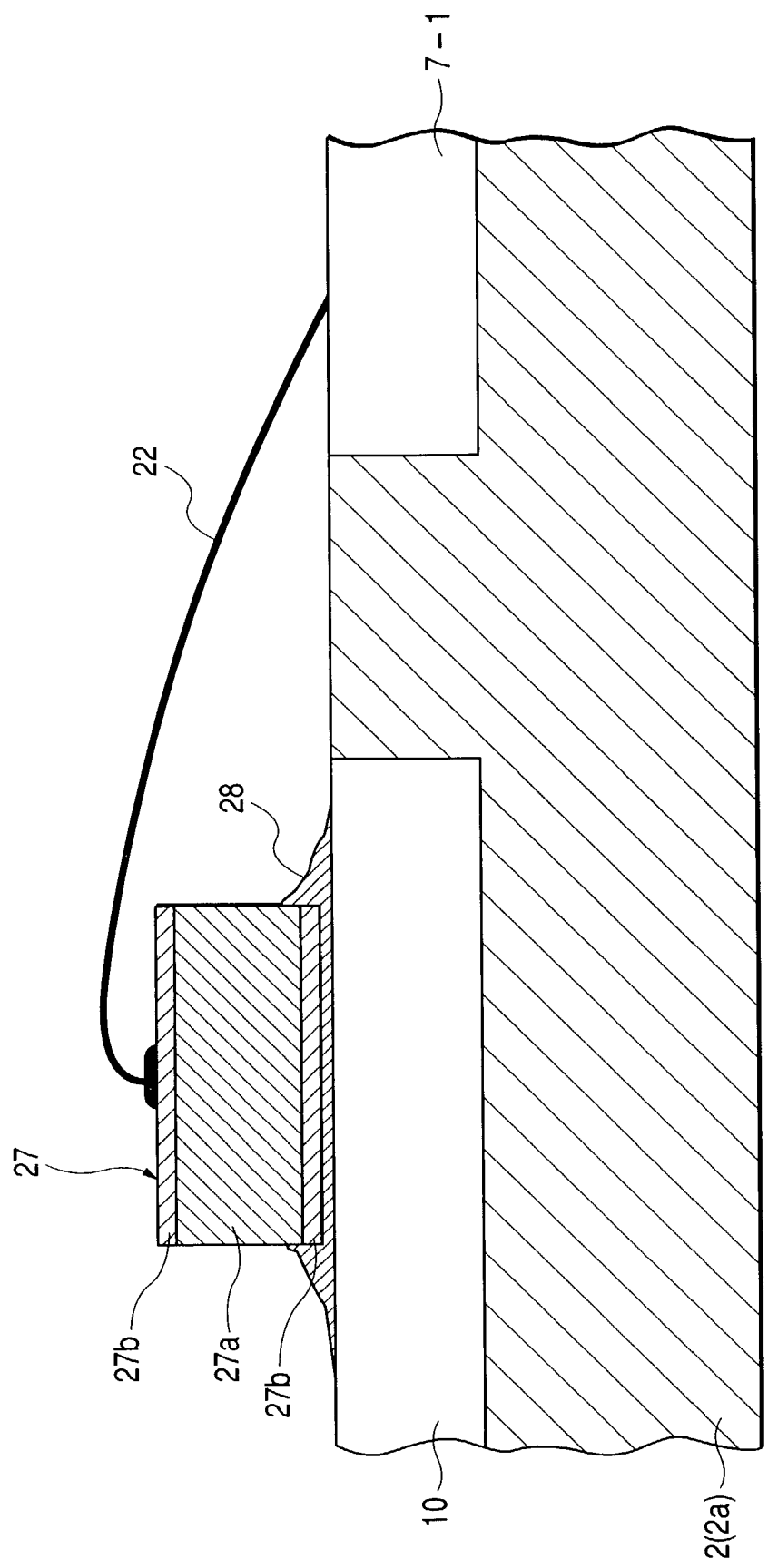

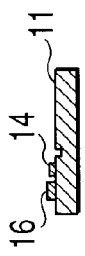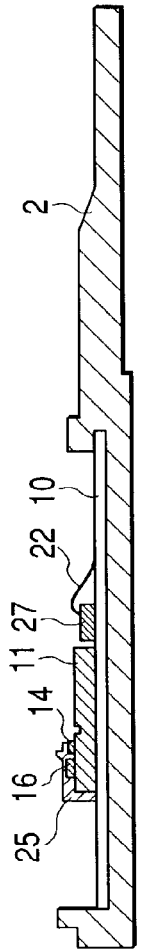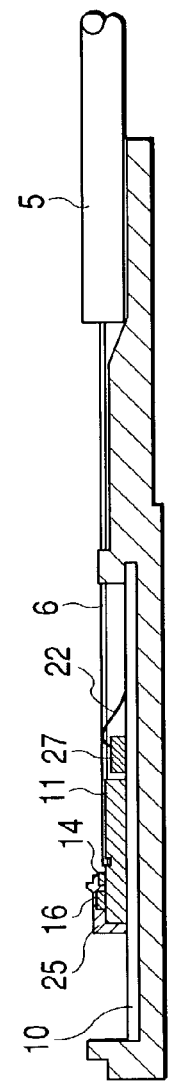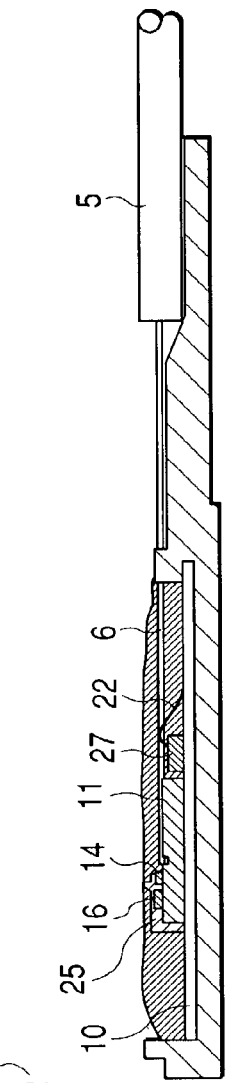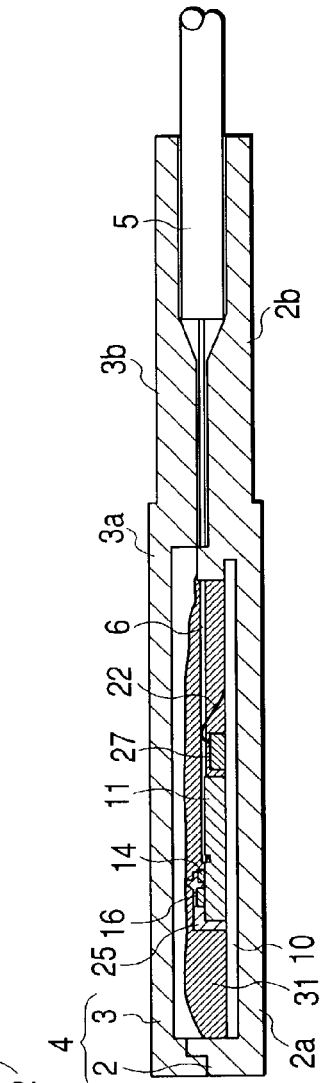
FIG. 7(a) MOUNT LASER DIODE AND PHOTO DIODE
FIG. 7(b) MOUNT COMPONENTS, WIRE BONDING
FIG. 7(c) FIX OPTICAL FIBER USING RESIN
FIG. 7(d) FILL SILICONE GEL
FIG. 7(e) SEAL USING PLASTIC CAP

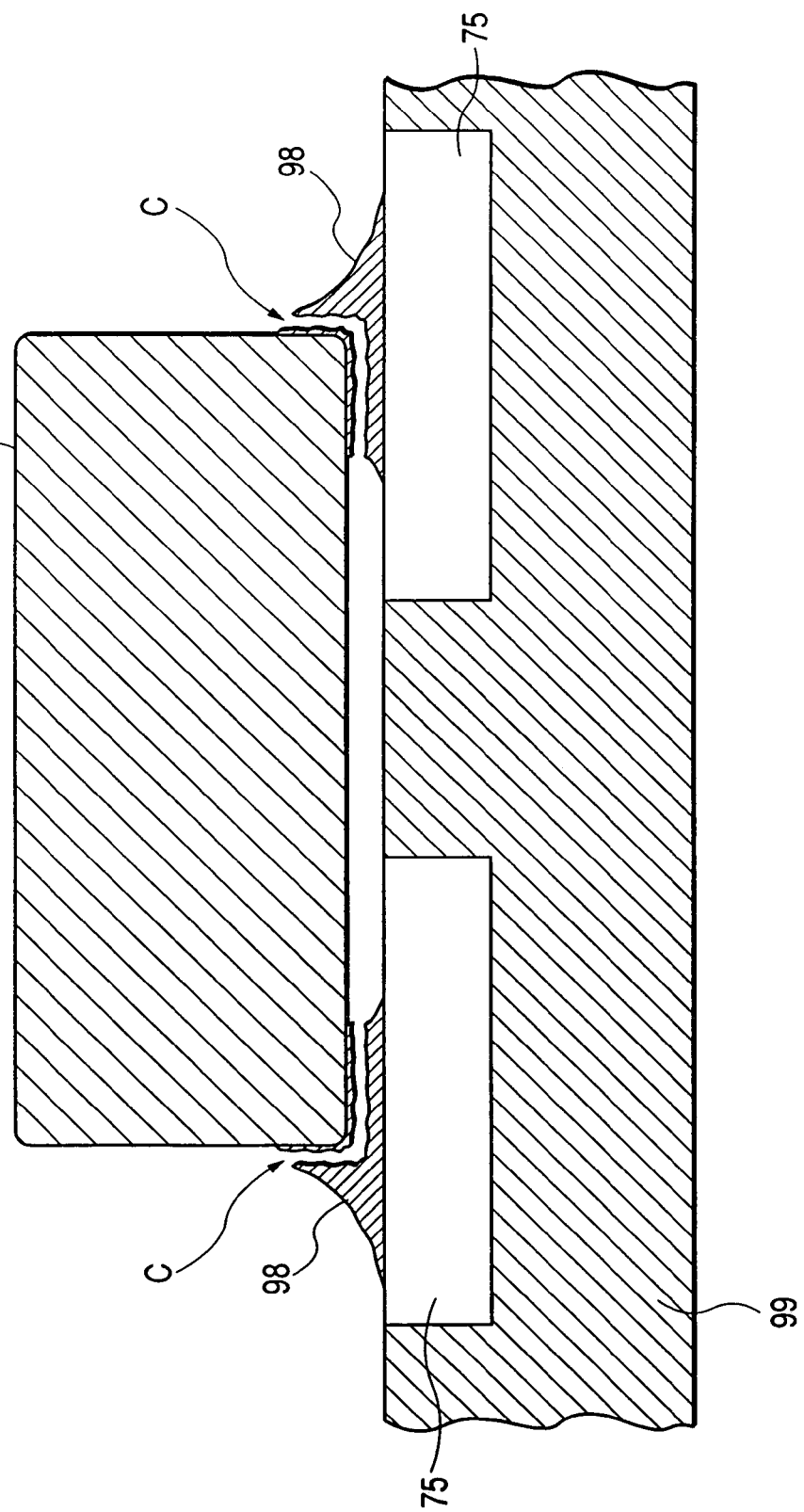

US 7,052,189 B2

OPTICAL ELECTRONIC DEVICE

BACKGROUND OF THE INVENTION

The present invention relates to an optical electronic device, and more particularly to a technique which is effectively applicable to a manufacturing technique of an optical communication module for transmission or reception in optical communication.

As a light source for an information processing device or a light source for optical communication device, a semiconductor laser (laser diode) has been used. In this case, a semiconductor laser element (semiconductor laser chip) which incorporates a semiconductor laser therein is incorporated into such an optical electronic device.

In an optical communication, optical electronic devices such as an optical communication module for transmission, an optical communication module for reception and the like are used. For example, Japanese Laid-open Patent Publication No. Hei 10(1998)-307235 discloses a semiconductor laser module for transmission and a manufacturing technique thereof.

This literature describes the semiconductor laser module which mounts a laser diode, a photo diode and an optical fiber on a main surface of a silicon substrate which is fixedly secured to an inner bottom surface of a package casing and seals the packaging casing with a cap. The packaging casing is configured such that the casing is formed of plastic by molding, and a pad portion having lead terminals, an optical fiber installing groove and an optical fiber cover installing portion formed in a side wall of the packaging casing are integrally formed.

Further, as an optical communication module of a type equal to the type of the above-mentioned optical communication module, there has been also known an optical communication module having a ceramic package structure which allows the package to have an air-tight sealing structure. As the optical communication module of this type having the ceramic package structure, a laser module described in "Data sheet DS01-0200PTO (Replaces DS99-023LWP) December, 2000, P1–P8, published by Lucent Technologies Ltd. microelectronics group has been known.

SUMMARY OF THE INVENTION

Inventors of the present invention have carried out an analysis and a review of optical communication modules to achieve the further enhancement of the characteristics and the reliability of optical communication modules for transmission or reception and the reduction of a manufacturing cost of these optical communication modules.

FIG. 18 is a schematic plan view of a ceramic-package-made Mini-DIL type optical communication module 70 for reception in a form that a cap is removed, wherein the module 70 was reviewed before the present invention was made. FIG. 19 is an internal circuit diagram of the module. In FIG. 18, numeral 71 indicates a ceramic package, numeral 72 indicates lines (conductive layers) which are printed on the ceramic package 72, numeral 73 indicates an optical fiber, numeral 74 indicates a support substrate formed of a silicon substrate, numeral 75 indicates lines on the support substrate 74, numeral 76 indicates a light receiving element (photo diode), numeral 77 indicates a pre-amplifying IC in which an amplifier is incorporated, numeral 78 indicates chip capacitors, and numeral 79 indicates conductive wires (gold lines, for example).

The light receiving element 76 is mounted on the support substrate 74 using a gold-tin solder, while the pre-amplifying IC 77 and the chip capacitors 78 are mounted on the lines 75 formed on the support substrate 74 using a silver paste material.

The support substrate 74 is mounted on the ceramic package 71 using a silver paste material. The wires 79 are extended from electronic parts mounted on the lines 75 formed on the support substrate 74 or mounted on the support substrate 74 to the lines 72 printed on the ceramic package 71. The lines are further extended to both side faces of the ceramic package 71 and leads 80 made of metal are fixed to portions of the lines extended to the side faces. The leads 80 constitute external electrode terminals. Symbols (1) to (8) are affixed to the leads (pins) 80. The lead (1) constitutes an anode terminal of the photo diode, the lead (4) constitutes a Vout terminal, the lead (7) constitutes a Vcc terminal, and the leads (2), (3), (5), (6), (8) constitute GND terminals.

The introduction of light to the light receiving element 76 is performed through the optical fiber 73 mounted on the support substrate 74. As can be clearly understood from the circuit diagram shown in FIG. 19, the chip capacitor 78 constitutes a filter for cutting noises to the pre-amplifying IC 77.

On the other hand, FIG. 20 is a schematic plan view of a ceramic-package-made Mini-DIL type optical communication module 85 for transmission at a bit rate of 2.5 Gb/s in a form that a cap is removed. FIG. 21 is an internal circuit diagram of the module. The optical communication module for transmission at a bit rate of not less than 2.5 Gb/s is generally provided with a bias T circuit therein as shown in FIG. 21. That is, the optical communication module includes a resistance and an inductance which constitute the bias T circuit therein.

In FIG. 20, numeral 86 indicates a ceramic package, numeral 87 indicates lines (conductive layers) printed on the ceramic package, numeral 88 indicates a lens, numeral 89 indicates a support substrate formed of a silicon substrate, numeral 90 indicates lines on the support substrate 89, numeral 91 indicates a laser diode (semiconductor laser element), numeral 92 indicates a photo diode (light receiving element) for monitoring, numeral 93 indicates a chip resistance, numeral 94 indicates a chip inductor, numeral 95 indicates a thermistor, and numeral 96 indicates wires (gold lines). Further, although not shown in the drawing, a distal end of the optical fiber faces the lens 88 in an opposed manner.

Leads (pins) 97 which are connected and fixed to both sides of the ceramic package 86 are provided in 8 pieces as indicated by symbols (1) to (8). The leads (1), (2) constitute a pair of electrode terminals of the thermistor 95, the lead (3) constitutes terminals of the laser diode 91 and the DC bias (−), the lead (4) constitutes a cathode-side terminal of the photo diode 92, the lead (5) constitutes an anode-side terminal of the photo diode 92, the lead (7) constitutes a signal terminal, and the leads (6), (8) constitute GND terminals.

The laser diode 91 and the photo diode 92 are mounted on the support substrate 89 using a gold-tin solder, while the support substrate 89 is mounted on the ceramic package 86 using a silver paste material. Further, the chip resistance 93, the chip inductor 94 and the thermistor 95 are mounted on the lines 87 printed on the ceramic package 86 using a lead-tin solder. In the optical communication modules shown in FIG. 18 and FIG. 20, the passive parts such as the chip capacitor, the chip resistance, the chip inductor and the like are generally mounted such that the passive part extends astride between two lines 75 (87) as shown in FIG. 22. FIG. 22 shows an example in which the chip capacitor 78 (chip resistance 93) is mounted as the electronic part. Electrodes formed at both ends of the chip capacitor 78 are connected using a bonding material 98 such as a gold-tin solder, a silver paste material or the like.

These ceramic-made Mini-DIL type optical communication modules are costly. Followings are considered as factors which pushes up the cost.

(1) The package is formed of expensive ceramic and hence, the package pushes up the cost of the optical communication module.

(2) Although V-shaped grooves are formed in the support substrate on which optical parts are mounted to ensure the accurate mounting of the optical fiber and the lens, the silicon substrate which constitutes the support substrate is expensive. Further, the optical communication module shown in FIG. 18 adopts the structure which mounts a large number of electronic parts (mounting parts constituted of the pre-amplifying IC 77 and five pieces of chip capacitors 78) on the support substrate and hence, the support substrate becomes large-sized and this further pushes up the cost.

(3) In the optical communication module shown in FIG. 18, a bonding material for the photo diode mounted on the support substrate and a bonding material for the IC, the capacitor and the like are different. Accordingly, the automation of mounting of the photo diode, the IC and the capacitor onto the support substrate becomes difficult and this pushes up the assembling cost.

(4) In the optical communication module shown in FIG. 20, a bonding material for fixing the support substrate to the ceramic package and a bonding material for mounting the inductor, the thermistor and the chip resistance are different. Accordingly, the automation of mounting of the support substrate, the inductor, the thermistor and the chip resistance onto the ceramic package becomes difficult and this pushes up the assembling cost.

To reduce the cost for manufacturing the above-mentioned optical communication modules, it is necessary to form the package using plastic, to miniaturize the silicon substrate and to automate the mounting of parts.

FIG. 23 shows a case in which the package of the ceramic-made Mini-DIL type optical communication module 70 for reception shown in FIG. 18 is replaced with a plastic package (plastic casing) 99 in which the leads are pre-molded with resin. In this structure, the package is formed of cheap resin and hence, the manufacturing cost of the package can be reduced. However, the plastic package is not configured to realize (2) the above-mentioned miniaturization of the silicon substrate and (3) the automation of assembling which constitute factors which push up the cost and hence, the cost reduction effect is small.

FIG. 24 shows a case in which the package of the ceramic-made Mini-DIL type optical communication module 85 for transmission shown in FIG. 20 is replaced with a plastic package (plastic casing) 99 in which the leads are pre-molded with resin. In this structure, the package is formed of cheap resin and hence, the manufacturing cost of the package can be reduced. Further, the silicon substrate is also miniaturized and hence, the manufacturing cost of the module can be reduced also in this respect. However, the plastic package is not configured to realize (4) the above-mentioned automation of assembling which constitutes the factor for pushing up the cost and hence, the cost reduction effect is still less than optimal.

In the optical communication module 85 for transmission shown in FIG. 24, when the chip resistance 93 and the chip inductor 94 which constitute the passive parts are mounted on the leads in the inside of the plastic package 99, it is necessary to mount each part such that the part extends astride between two leads. Accordingly, there is a possibility that the plastic package repeats expansion and contraction due to a temperature cycle and the cracks occur in the bonding material which bonds the leads and the passive parts.

FIG. 25 shows the plastic-made Mini-DIL type optical communication module 70 for reception which the inventors of the present application produced as a model. In the optical communication module shown in FIG. 25, out of five pieces of capacitors, two pieces of capacitors are constituted of two chip capacitors 78 each of which includes electrodes at both ends thereof and remaining three pieces of capacitors are constituted of plate capacitors 78c each of which include electrodes on both upper and lower surfaces thereof. With respect to two lateral-type chip capacitors 78, one electrode is connected to one lead via a bonding material 98 and the other electrode is fixed to the other lead arranged adjacent to one lead via a bonding material 98. A silver paste material is used as the bonding material 98. When a temperature cycle test was carried out at a temperate range of 40 to 85 degree centigrade with respect to the optical communication module having such a structure, as shown in FIG. 26, at approximately 1000 cycles, cracks C occurred in the bonding material 98 and the chip capacitor 78 was peeled off from the plastic package 99.

Accordingly, it is an object of the present invention to provide an optical electronic device having a plastic package structure which exhibits high reliability in mounting of electronic parts.

It is another object of the present invention to provide an optical electronic device having a plastic package structure which can minimize the occurrence of cracks in electrode bonding portions of passive parts such as a chip resistance, a chip capacitor, a chip inductor and the like.

It is still another object of the present invention to provide an optical electronic device having a plastic package structure which can be manufactured at a low cost.

The above-mentioned and other objects and novel features of the present invention will become apparent from the description of this specification and attached drawings.

To briefly explain the summary of typical inventions out of the inventions disclosed in the present application, they are as follows.

(1) An Optical Electronic Device Comprises:

a package casing made of plastic (for example, fully aromatic polyester);

a cap which seals the package casing;

a plurality of metal-made leads which extend between the inside and the outside of the package casing, the leads forming electrode terminals at external portions thereof, a lead base which is arranged on an inner bottom of the package casing, the lead base integrally formed with at least one or the plurality of leads;

a support substrate which is fixed onto the lead base and includes a conductive layer of a given pattern on an upper surface thereof;

an optical element which is fixed onto the support substrate;

an optical fiber which extends between the inside and the outside of the package casing, the optical fiber having an inner end thereof to face the optical element, the optical fiber fixed onto the support substrate such that the transmission and the reception of light are performed between the optical element and the optical fiber;

one or a plurality of electronic parts fixed to the leads in the inside of the package casing; and conductive wires which electrically connect electrodes of the optical element, electrodes of the electronic parts, the conductive layer of the support substrate and the leads to each other when necessary, wherein the electronic part includes one or a plurality of upper electrodes and the upper electrodes are connected to other conductive portions via conductive wires.

In one aspect of this optical electronic device, both of a pair of electrodes of the electronic part which differ in polarity are not fixed to the same lead or the support substrate.

As the electronic part, the chip resistance or the chip inductor which forms two electrodes differing in polarity on an upper surface thereof is fixed. As the electronic part, a thermistor which forms electrodes differing in polarity on an upper surface and a lower surface thereof separately is fixed. As the electronic part, an integrated circuit device which forms electrodes on an upper surface thereof is mounted.

The support substrate, the optical element and the electronic parts are respectively mounted on given places using a silver paste material and the optical fiber is fixed to the support substrate using a gold-tin solder.

According to the above-mentioned means (1), following advantages can be obtained.

(a) Although the passive parts such as the chip resistance, the chip inductor and the chip resistance are fixed to the leads or the like, the upper electrodes are connected to other leads or the like using the flexible wires. Accordingly, even when the difference between the thermal coefficient of the metal which constitutes the leads and the thermal coefficient of the plastic which constitutes the package is large, it is possible to eliminate the peeling-off of the electronic parts or the like which constitute passive parts at the bonding portions thereof which may be caused by an ambient stress such as a temperature cycle and hence, the reliability of the optical electronic device is enhanced.

(b) The optical electronic device is configured such that while the optical element is substantially mounted on the support substrate which is formed of an expensive silicon substrate, the electronic parts are mounted on the lead portions in the inside of the package and hence, the support substrate can be miniaturized whereby the manufacturing cost of the optical electronic device can be reduced.

(c) The optical electronic device is configured such that the support substrate and the electronic parts are fixed using the bonding materials formed of same material and hence, the automation of mounting of parts can be realized whereby the manufacturing cost of the optical electronic device can be reduced.

(d) The package is formed of the plastic package (fully aromatic polyester) and hence, the manufacturing cost of the optical electronic device can be reduced.

BRIEF DESCRIPTION OF THE DRAWINGS

FIG. 6 is a schematic cross-sectional view showing a state in which a thermistor chip is mounted in the optical communication module for transmission.

FIGS. 7(a) to 7(e) are flow charts showing schematic respective steps of a method for manufacturing the optical communication module for transmission.

FIG. 26 is a schematic view showing a state in which bonding of a chip resistance is defective.

DETAILED DESCRIPTION OF THE PREFERRED EMBODIMENTS

A preferred embodiment of the present invention is explained in detail hereinafter in conjunction with attached drawings. Here, in all drawings which are served for explaining the embodiments of the present invention, parts having identical functions are indicated by same symbols and repeated explanation of these parts is omitted.

(Embodiment 1)

Figure 1:
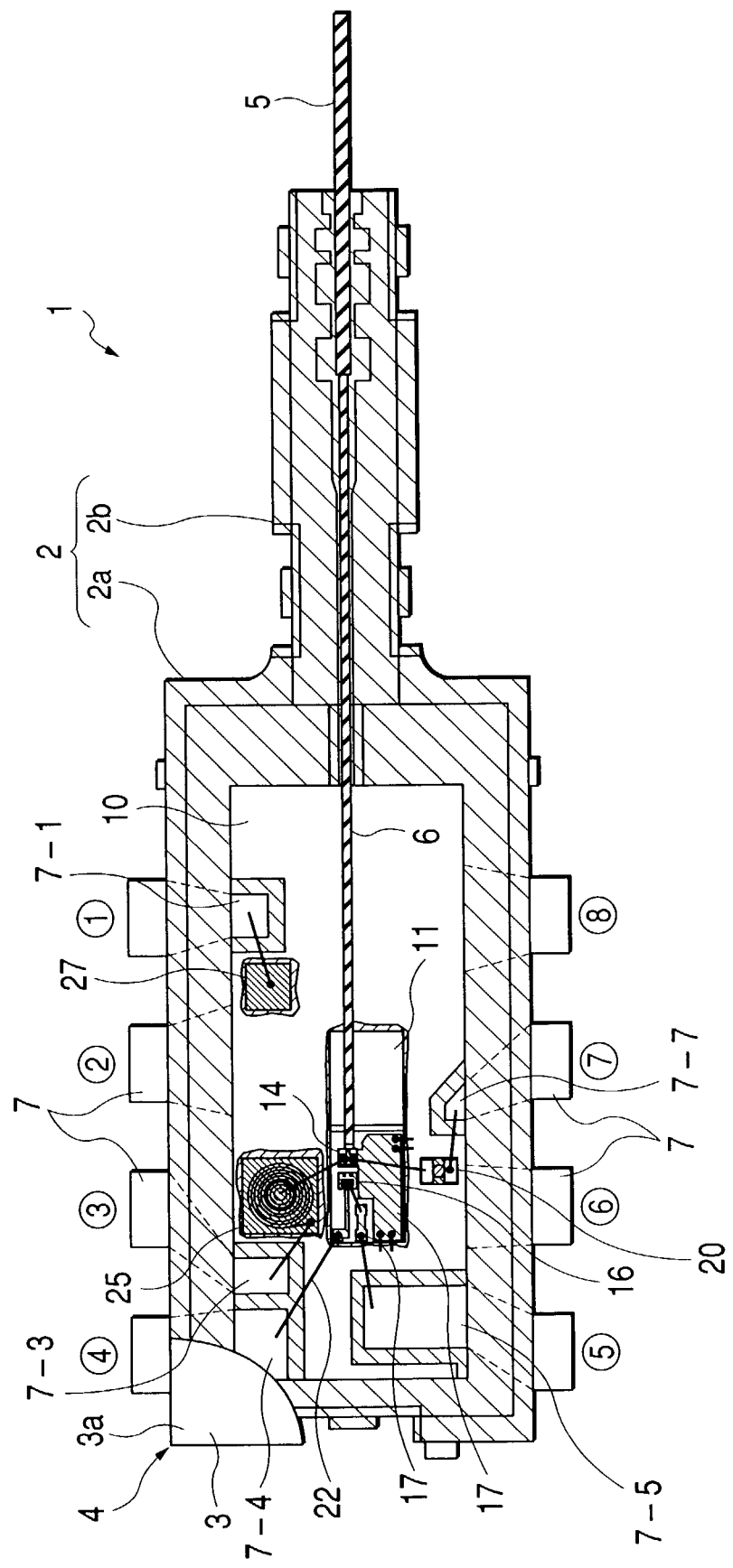
FIG. 1 is a plan view showing an inner structure of an optical communication module for transmission according to one embodiment (embodiment 1) of the present invention.
Figure 2:
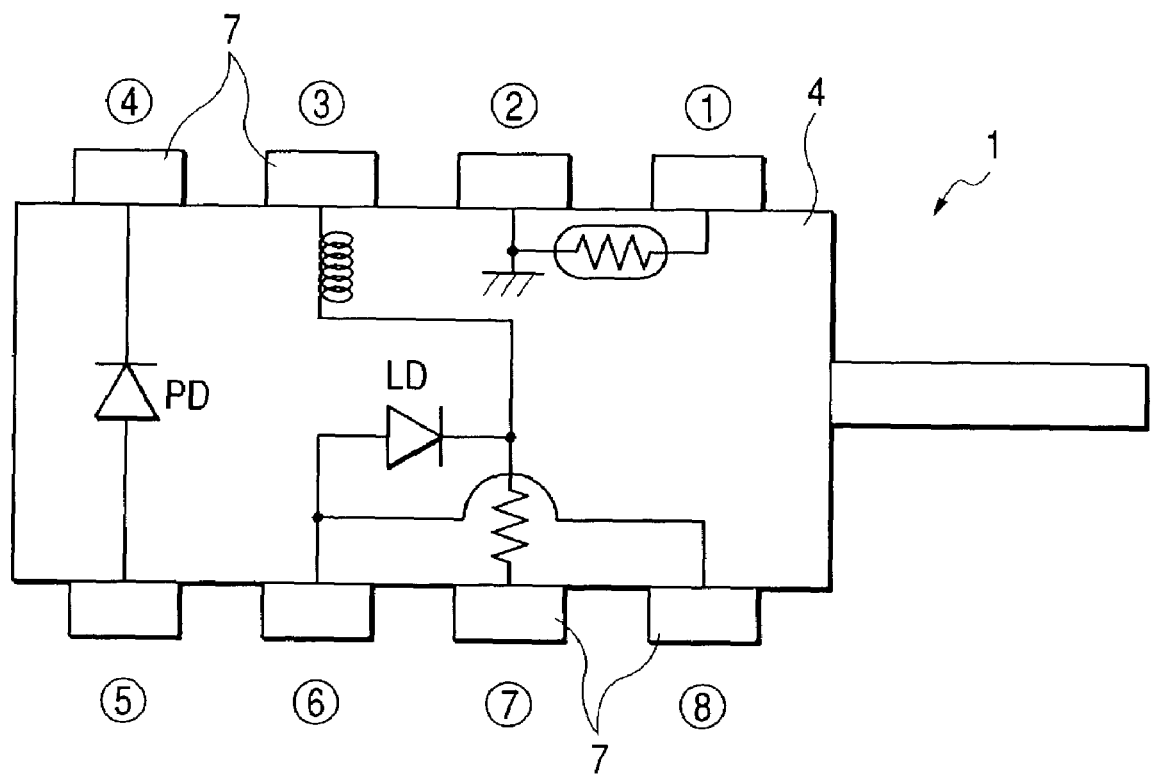
FIG. 2 is a circuit diagram of the optical communication module for transmission.
Figure 3:
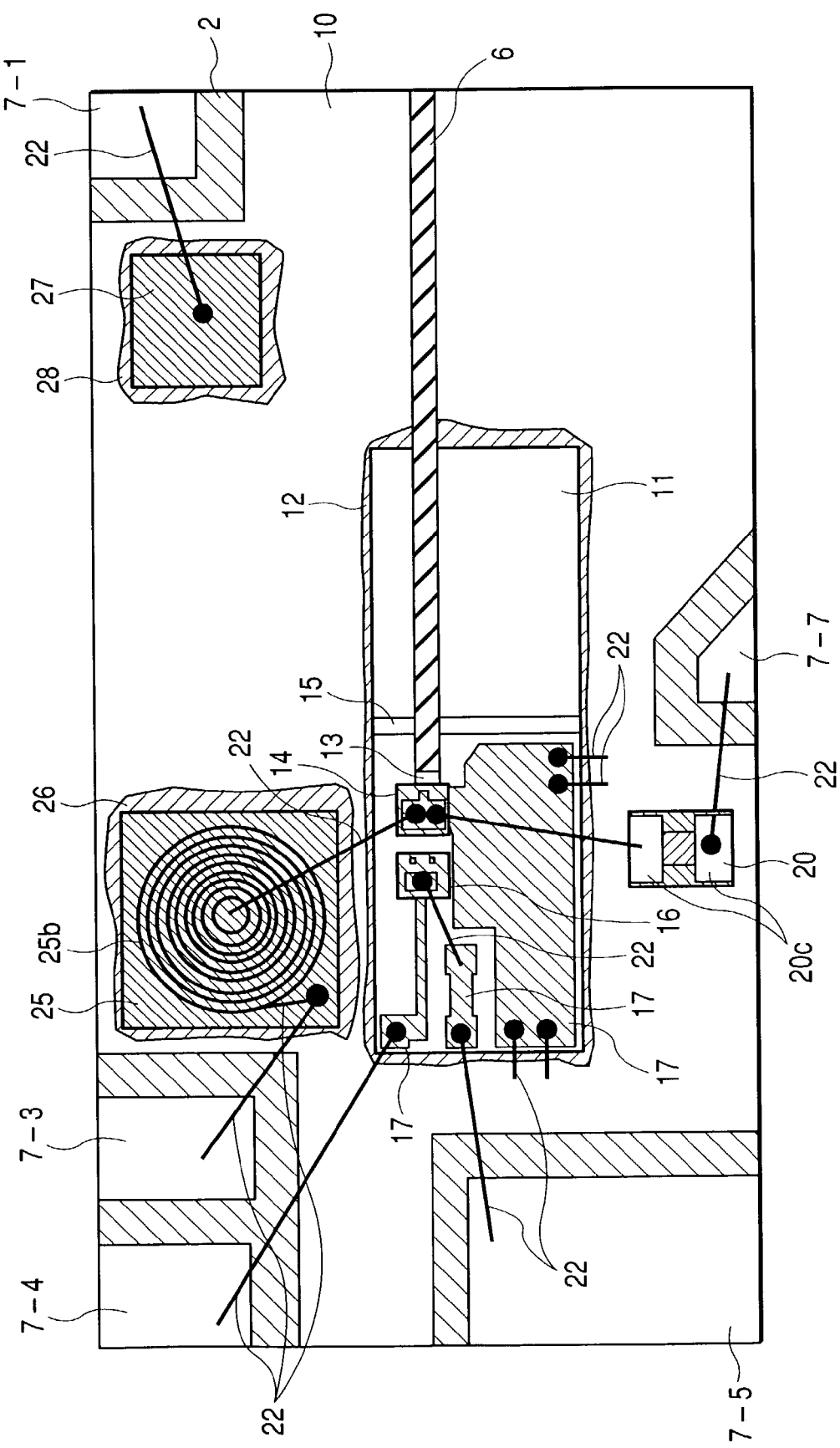
FIG. 3 is an enlarged plan view showing an arrangement of parts of the optical communication module for transmission.

FIG. 1 to FIG. 7 are views showing an optical communication module (optical electronic device) for transmission according to one embodiment (embodiment 1) of the present invention. FIG. 1 is a plan view showing an inner structure of optical communication module for transmission, FIG. 2 is a circuit diagram of the optical communication module for transmission, and FIG. 3 is an enlarged plan view showing an arrangement of parts.

In this embodiment 1, an example in which the present invention is applied to the optical communication module for transmission having a bit rate of 2.5 Gb/s is explained. The inner structure of the optical communication module 1 for transmission according to the embodiment 1 is shown in FIG. 1.

In the optical communication module 1 for transmission according to this embodiment 1, as shown in FIG. 1, a package (sealed casing) 4 is formed of a casing 2 and a cap 3 which is overlapped to the casing 2 such that the cap 3 seals the casing 2 and is fixed to the casing 2 by a bonding material. Both the casing 2 and the cap 3 are formed of plastic. The plastic may be made of fully aromatic polyester, for example. The casing 2 and the cap 3 have substantially the same profile.

Both the casing 2 and the cap 3 are respectively constituted of rectangular body portions 2a, 3a and guide portions 2b, 3b which are projected from the centers of one ends of the body portions 2a, 3a in an elongated shape. The body portion 2a of the casing 2 has a box-like structure with an upper portion thereof open-ended. Grooves are formed in the centers of the guide portions 2b, 3b along the extending direction thereof and an optical fiber cable 5 and an optical fiber 6 which is formed by exposing a distal end side of the optical fiber cable 5 are guided by the grooves. The guide portions (grooves) are also formed on a lower surface of the cap 3 corresponding to the former grooves. The cap 3 is formed in a plate shape so as to clog or seal the opened portion or the grooves formed in the casing 2.

A plurality of leads 7 are projected from both sides of the casing 2. In this embodiment 1, all of these leads 7 have portions thereof which are projected from both sides of the casing 2 bent downwardly and hence, the leads 7 can be molded in a dual-in-line (DiI) type.

As shown in FIG. 1, a lead base 10 having a wide width which is formed of a material equal to that of the leads 7 is mounted on an inner bottom of the casing 2. Further, inner ends of the leads 7 are respectively arranged around or in the periphery of the lead base 10. The lead base 10 and the leads 7 are assembled to the casing 2 at the time of molding the casing 2.

That is, although not shown in the drawing, the casing 2 is formed by applying resin molding (pre-molding) to a lead frame which is produced by patterning a sheet of flat metal plate. The lead base 10 and leads 7 are respectively arranged at given places of the lead frame. With respect to the lead frame, the lead base 10 and the leads 7 which make distal ends thereof face the periphery of the lead base 10 are molded such that the lead base 10 and the leads 7 are exposed to an inner bottom of the casing 2.

A plurality of guide holes or the like are formed at both sides of the lead frame. Such a lead frame is conveyed on an assembly line and is subjected to assembling and machining treatments in respective work stations. The above-mentioned guide holes are utilized for conveying, positioning or the like of the lead frame. After the cap 3 is mounted on the casing 2, portions of the leads 7 which are projected from both sides of the casing 2 are cut from a frame portion of the lead frame. Then, respective leads 7 are molded in a dual-in-line type thus manufacturing the optical communication module 1 for transmission.

The leads 7 are also used respectively as external electrode terminals. Since the lead base 10 also constitutes a GND, out of a plurality of leads 7, a few leads 7 are connected to the lead base 10. In this embodiment 1, the leads 7 are arranged in a symmetry such that four leads 7 are arranged at each side of the casing 2. Respective leads 7 are indicated by numerals (1) to (8). The leads (1), (2) constitute a pair of electrode terminals of a thermistor, wherein the lead 2 is a GND terminal. The lead (3) constitutes a cathode terminal of a laser diode, the lead (4) constitutes a cathode terminal of a photo diode, the lead (5) constitutes an anode terminal of the photo diode, the lead (6) constitutes an anode terminal of the laser diode, the lead (7) constitutes a cathode terminal of the laser diode, and the lead (8) constitutes an anode terminal of the laser diode. Accordingly, the leads (2), (6), (8) are integrally formed with the lead base 10 and other leads (1), (3), (4), (5), (7) are formed electrically independent from each other.

FIG. 3 shows respective parts mounted on the inner bottom surface of the body portion 2a of the casing 2. In FIG. 3, the body portion 2a is formed in a rectangular shape with both sides of the inner bottom surface partially omitted. In FIG. 3, an inner end portion (lead 7-1) of the lead (1) is positioned at a right upper corner of the rectangular shape, an inner end portion (lead 7-3) of the lead (3) and an inner end portion (lead 7-4) of the lead (4) and are positioned at a left upper corner of the rectangular shape, an inner end portion (lead 7-5) of the lead (5) is positioned at a left lower corner of the rectangular shape, and an inner end portion (lead 7-7) of the lead (7) is positioned at a lower center portion of the rectangular shape. Since it is necessary to make respective leads 7-1, 7-3, 7-4, 7-5, 7-7 electrically independent from each other, a pattern which defines a fixed distance among respective leads 7-1, 7-3, 7-4, 7-5, 7-7 is adopted by the lead base 10 so that these leads extend widely on the inner bottom surface.

In the guide portion 2b of the casing 2, an optical fiber cable 5 and an optical fiber 6 which is exposed at a distal end side of the optical fiber cable 5 are guided. Onto a portion of the lead base 10 which is disposed on an extension line of an optical fiber axis of the optical fiber 6, as shown in FIG. 3, an insulating support substrate 11 is fixed using a silver paste material 12 (subjected to a hardening treatment at a temperature of 140 degree centigrade for 30 minutes). The support substrate 11 is formed of a silicon single crystal plate which is referred to as a silicon platform. As the support substrate 11, a material is used which has a thermal expansion coefficient similar to a thermal expansion coefficient of quartz or the like constituting an optical element such as a semiconductor laser chip or a photo diode chip, or the optical fiber. Accordingly, the support substrate 11 may be formed of an insulating substrate made of aluminum nitride, silicon carbide or the like besides silicon.

The support substrate 11 is formed in a rectangular shape which is elongated along the extension direction of the optical fiber 6 and a groove 13 which guides the optical fiber 6 is formed in an upper surface of the support substrate 11 at an offset position. The groove 13 is extended to a position in the vicinity of a region where a semiconductor laser element (semiconductor laser chip) 14 having one or plurality of laser diodes is fixed as an optical element. A distal end of the optical fiber 6 faces one irradiation face of the laser diode in an opposed manner.

On the upper surface (main surface) of the support substrate 11, a discharge groove 15 which crosses the above-mentioned groove 13 and makes both ends thereof respectively reach ends of the support substrate 11 is formed. This discharge groove 15 is provided, at the time of fixing the optical fiber 6 to the support substrate 11 using a bonding material such as AuSn solder or the like, for discharging an excessive bonding material to the outside so as to prevent the bonding material from flowing out between the optical fiber 6 and the semiconductor laser element 14. The discharge groove 15 is formed at an approximately intermediate portion of the rectangular support substrate 11. A line 17 having a given pattern is formed on the main surface of the support substrate 11 at a left side of the discharge groove 15. A portion of the line 17 constitutes a pad for fixing a semiconductor laser element 14 and a light receiving element 16.

At a position along the extension line of the distal end of the optical fiber 6 on the support substrate 11, the semiconductor laser element 14 and the light receiving element 16 are arranged in parallel. Laser beams irradiated from a frontal irradiating face of the semiconductor laser element 14 are taken into the inside of the optical fiber 6 through the distal end face of the optical fiber 6, and the laser beams irradiated from a rear irradiating face of the semiconductor laser element 14 have the intensity of optical output power thereof monitored by the light receiving element 16.

Figure 4:
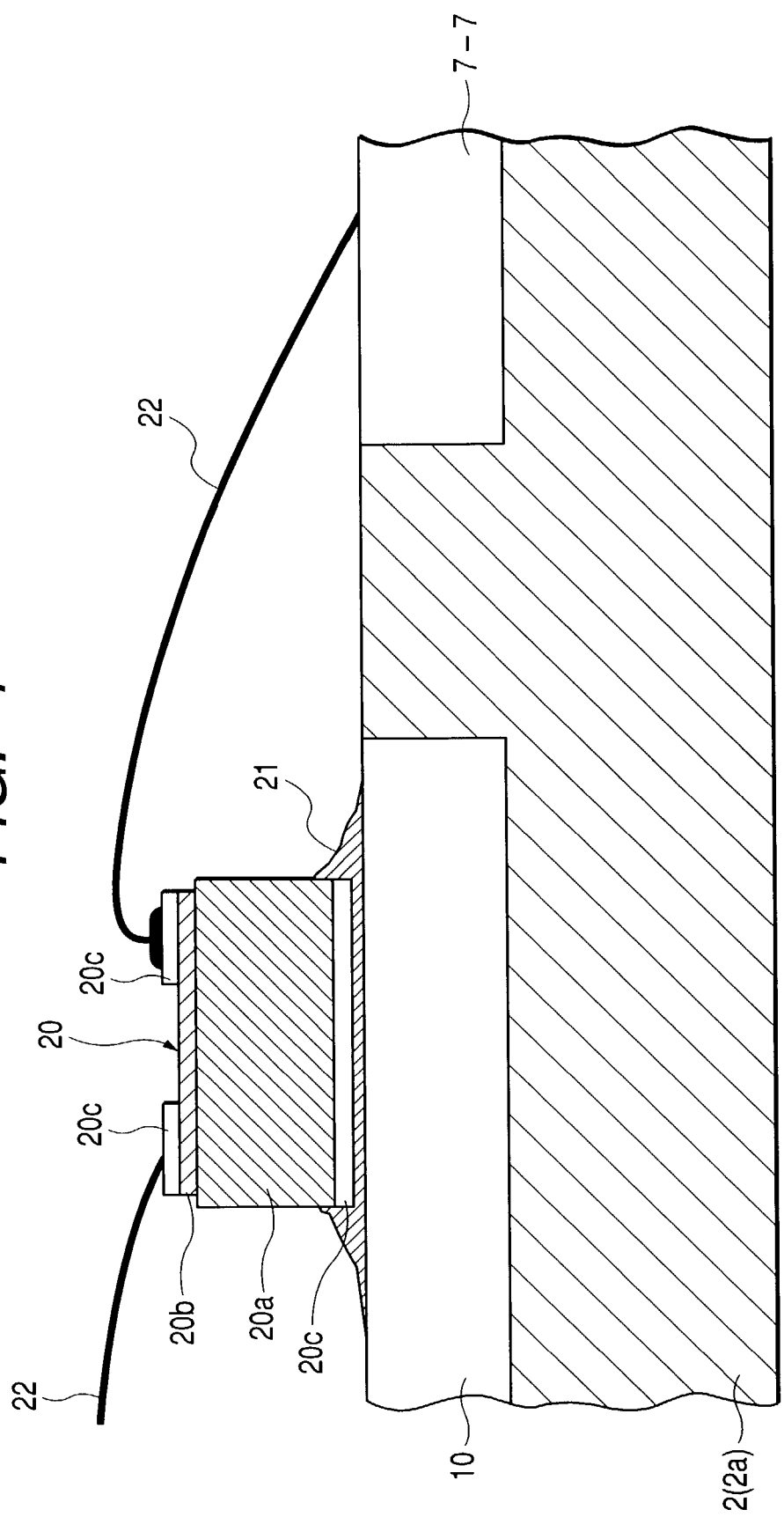
FIG. 4 is a schematic cross-sectional view showing a state in which a chip resistance is mounted in the optical communication module for transmission.

To the upper surface of the lead base 10, a chip resistance 20 is fixed at a position adjacent to the lead 7-7 and relatively close to the semiconductor laser element 14. As shown in FIG. 4, the chip resistance 20 includes a resistance layer 20b on an upper surface of a substrate 20a and also includes electrodes 20c which differ in polarity from each other on an upper surface of the resistance layer 20b at both ends thereof. An electrode 20c is also formed on a lower surface of the substrate 20a. The chip resistance 20 is fixed to the lead base 10 using a bonding material 21. In this embodiment 1, a silver paste material (subjected to a hardening treatment at a temperature of 140 degree centigrade for 30 minutes) is used as the bonding material 21. One electrode 20c formed on the upper surface of the resistance layer 20b is electrically connected to the lead 7-7 through a conductive wire 22, while another electrode 20c is electrically connected to an upper electrode of the semiconductor laser element 14 through a conductive wire 22 (see FIG. 3). A gold line, for example, is used as the wire 22.

Figure 5:
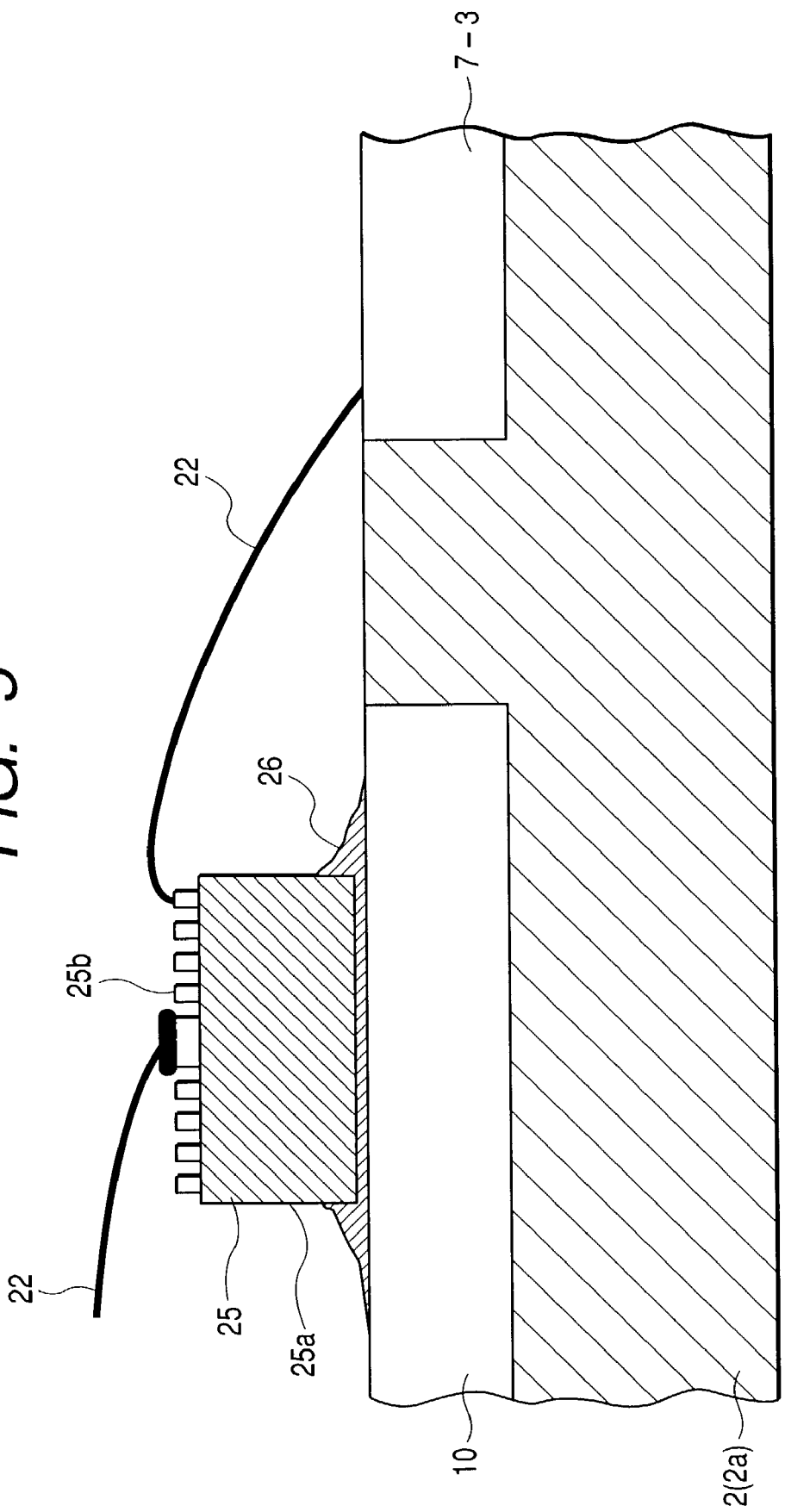
FIG. 5 is a schematic cross-sectional view showing a state in which a chip inductor is mounted in the optical communication module for transmission.

To the upper surface of the lead base 10, a chip inductor 25 is fixed at a position adjacent to the lead 7-3 and relatively close to the semiconductor laser element 14. As shown in FIG. 5, the chip inductor 25 has a conductive layer 25b which is wound in an eddy shape on an upper surface of a ceramic plate 25a. The chip inductor 25 is fixed onto the lead base 10 using a bonding material 26. In this embodiment 1, a silver paste material (subjected to a hardening treatment at a temperature of 140 degree centigrade for 30 minutes) is used as the bonding material 26.

A center portion of the conductive layer 25b which extends in an eddy shape is electrically connected to an upper electrode of the semiconductor laser element 14 by way of the wire 22 (see FIG. 3) and an extremity portion of the eddy is electrically connected to the lead 7-3 through the conductive wire 22. The wire 22 is formed of a gold line.

A thermistor 27 is fixed to the upper surface of the lead base 10 at a position adjacent to the lead 7-1. As shown in FIG. 6, the thermistor 27 has electrodes 27b which differ in polarity from each other on upper and lower surfaces of a ceramic substrate 27a respectively. The ceramic substrate 27a is fixed onto the lead base 10 using a bonding material 28. In this embodiment 1, a silver paste material (subjected to a hardening treatment at a temperature of 140 degree centigrade for 30 minutes) is used as the bonding material 28.

The electrode 27b formed on the lower surface of the ceramic substrate 27a is electrically connected to the lead base 10 through the conductive bonding material 28, while the electrode 27b formed on the upper surface of the ceramic substrate 27a is electrically connected to the lead 7-1 through the conductive wire 22. The wire 22 is formed of a gold line.

In this manner, the electronic parts, that is, the chip resistance 20, the chip inductor 25 and the thermistor 27 which constitute passive parts in this embodiment are fixed to the lead base 10, and the electrodes which are formed on respective upper surfaces are fixed to given conductive portions (electrodes, leads or the like) by way of the wires 22. Accordingly, even when there exists difference between the thermal expansion coefficient of plastic which forms the casing 2 and the cap 3 and the thermal expansion coefficient of the leads 7 and the lead base 10 formed of an iron-nickel based alloy, a thermal stress is not applied to the chip parts by way of the wires made of the flexible material so that there is no possibility that cracks occur in the silver paste material which fixes the chip parts due to a thermal strain (thermal stress) whereby peeling-off of the chip parts can be prevented.

In other words, the electronic part is not fixed to two leads which are arranged while sandwiching resin therebetween through the bonding material, but is fixed to any one of these leads, and the electrode of the electronic part which is not electrically connected to the lead to which the electronic part is fixed is connected to the neighboring lead to which the electronic part is not fixed or to other conductive portion through the flexible and conductive wire. Accordingly, there is no possibility that cracks attributed to the thermal strain occur at the bonding portions of the electronic part.

While the semiconductor laser element 14 has the electrode on the lower surface thereof, the electrode is electrically connected to the line 17 formed on the main surface of the support substrate 11 and the line 17 is electrically connected to the lead base 10 by way of the wire 22. The electrode formed on the semiconductor laser element 14 is electrically connected to the center portion of the conductive layer 25b of the chip inductor 25 which is arranged in an eddy shape byway of the wire 22 and, at the same time, is electrically connected to one electrode of the chip resistance 20 by way of the wire 22.

While the light receiving element 16 has the electrode on the lower surface thereof, the electrode is electrically connected to the line 17 formed on the main surface of the support substrate 11 and the line 17 is electrically connected to the lead 7-4 by way of the wire 22. Further, the electrode formed on an upper surface of the light receiving element 16 is electrically connected to the line 17 formed on the main surface of the support substrate 11 by way of the wire 22 and the wire 17 is electrically connected to the lead 7-5 by way of the wire 22. Accordingly, respective electrodes of the semiconductor laser element 14, the light receiving element 16, the chip resistance 20, the chip inductor 25 and the thermistor 27 are electrically led to any one of these leads 7.

The casing 2 and the cap 3 are formed of fully aromatic polyester which is thermoplastic resin. The fully aromatic polyester has characteristics shown in Table 1. A, B, C, E which are listed as product names indicate commercially available resins which are used for forming plastic casings or the like. The product name D indicates the fully aromatic polyester resin used in this embodiment 1. In Table 1, the bending rapture strength (MPa), the tensile strength (MPa), the thermal expansion rate (ppm) of resins of respective product names are shown.

The fully aromatic polyester exhibits the substantially equal thermal expansion rate as other resins and hence, it is understood that the fully aromatic polyester is suitable as the material of plastic casing. However, the fully aromatic polyester exhibits the extremely high values with respect to the bending rapture strength and the tensile strength compared with other resins and hence, it is understood that the fully aromatic polyester is suitable as the material of the casing and the cap.

Further, Table 2 shows the thermal expansion coefficients of silicon which constitutes one of materials of the support substrate and a 42 alloy which is an iron-nickel based alloy constituting a material of the lead frame. As can be understood from this Table 2, the lead frame made of the 42 alloy and the support substrate made of silicon exhibit the similar thermal expansion coefficients and hence, the influence of thermal stress attributed to the thermal expansions of both parts is small whereby these materials can be favorably used.

TABLE 1

| product name | bending rapture strength (MPa) | tensile strength (Mpa) | thermal expansion rate (ppm) |
|---|---|---|---|
| A | 100 | 80 | (64) |
| B | 122 | 92 | (64) |
| C | 189 | 127 | 69 |
| D | 211 | 161 | 64 |
| E | 138 | 88.7 | 51 |

TABLE 2

| item | lead frame (42 alloy) | support substrate (silicon) | unit |
|---|---|---|---|
| thermal expansion coefficient | $4.5 \times 10^{-6}$ | $3.5 \times 10^{-6}$ | /° C. |

Although not shown in the drawing, the optical fiber cable 5 is covered with a jacket (fiber jacket) which constitutes a protective tube and has a portion thereof extended from a middle portion of a guide portion 2b of the casing 2 to the distal end thereof peeled off. By peeling off the jacket, a clad which is formed of quartz or the like is exposed. A core is positioned at the center of the clad. In the inside of the guide portions 2b, 3b, the optical fiber cable 5 and the optical fiber 6 are fixed with resin. In fixing the optical fiber cable 5 and the optical fiber 6, to prevent the intrusion of moisture along the optical fiber cable 5, the resin is embedded over the entire periphery of the optical fiber cable 5.

The optical fiber 6 is guided by the groove 13 having a V cross section which is formed on the main surface of the support substrate 11 and is fixed to the support substrate 11 using a UV curing/thermosetting resin not shown in the drawing. The UV curing/thermosetting resin is a resin which has a characteristic that the resin is hardened by the irradiation of ultraviolet lays (UV) and also has a characteristic that the resin is hardened by heating.

First of all, the optical fiber 6 is fixed to the support substrate 11 by irradiating the ultra violet rays and, thereafter, the optical fiber 6 including a portion to which the ultraviolet rays are not irradiated is hardened by heating so that the optical fiber 6 is reliably fixed to the support substrate 11. Further, in the inside of the casing 2, a protective film 31 which is transparent with respect to light transmitted through the optical fiber 6 and exhibits resistance to moisture (see FIG. 7d) is filled. The protective film 31 covers the lead base 10, the lead portions which extend around the lead base 10, the support substrate 11, the semiconductor laser element 14, the light receiving element 16, the chip resistance 20, the chip inductor 25, the thermistor 27, the optical fiber 6 and the like and hence, the moisture resistance of the semiconductor laser element 14, the light receiving element 16 and the like is enhanced.

The protective film 31 is made of a flexible silicone gel, for example. Here, the material of the protective film 31 is not limited to the silicone gel and other material such as silicone rubber, low-stress epoxy resin, acrylic resin, urethane resin can be used.

Subsequently, a method for manufacturing the optical communication module 1 for transmission according to the embodiment 1 is explained in conjunction with FIGS. 7(a) to (e) First of all, after preparing the support substrate 11 formed of the silicon substrate as shown in FIG. 7(a), the semiconductor laser element 14 and the light receiving element 16 are positioned on the main surface of the support substrate 11 and are fixed (mounted) to the support substrate 11 using an AuSn solder as the bonding material.

Then, as shown in FIG. 7(b), the parts are mounted on the body portion 2a of the casing 2. On the inner bottom surface of the body portion 2a of the casing 2, the lead base 10, the leads 7-1, 7-3, 7-4, 7-5, 7-7 are arranged. (see FIG. 3). Then, the support substrate 11 on which the semiconductor laser element 14 and the light receiving element 16 are mounted, the chip resistance 20, the chip inductor 25 and the thermistor 27 are positioned and mounted at given places. All these parts use the silver paste material as the bonding material. By applying the baking treatment to the silver paste material at a temperature of 140 degree centigrade for 30 minutes, respective parts are simultaneously fixed.

In this manner, mounting of the optical element to the support substrate 11 and mounting of respective parts to the casing 2 are performed in two steps and the parts are fixed using the same bonding material in respective steps and hence, the automation of mounting of parts can be realized whereby the manufacturing cost can be reduced.

Further, after mounting the parts, as shown in FIG. 7(b), given portions of the parts are connected using the conductive wires 22 (see FIG. 3). That is, the conductive portions such as the electrodes, the lines, the lead portions (including the lead base) and the like are connected to each other using the conductive wires 22.

Subsequently, as shown in FIG. 7(c), the optical fiber 6 is fixed with the resin. That is, the optical fiber cable 5 which forms the optical fiber 6 at the distal end side thereof is prepared. The optical fiber cable 5 is overlapped to the groove formed on the guide portion 2b of the casing 2, while the distal end portion of the optical fiber 6 is overlapped to the inside of the groove 13 having a V cross section formed in the support substrate 11 (see FIG. 3). Thereafter, the distal end of the optical fiber 6 is positioned such that the distal end faces the frontal irradiating face of the semiconductor laser element 14 in an opposed manner.

Thereafter, the optical fiber 6 is fixed to the support substrate 11 using the UV curing/thermosetting resin and, at the same time, the optical fiber 6 and the optical fiber cable 5 at the guide portion 2b are fixed to the guide portion 2b using the UV curing/thermosetting resin. After applying the UV curing/thermosetting resin to given places, ultraviolet rays are irradiated to the UV curing/thermosetting resin. Due to this irradiation of ultraviolet rays, portions of the UV curing/thermosetting resin which receive the ultraviolet rays are hardened and hence, the optical fiber 6 and the optical fiber cable 5 are fixed to the support substrate 11 and the casing 2 (first hardening treatment).

Subsequently, as shown in FIG. 7(d), the silicone gel for forming the protective film 31 is supplied to the body portion 2a of the casing 2. The supply of the silicone gel is performed to an extent that the silicone gel does not flow out from the body portion 2a. The silicone gel completely covers respective parts, the wires 22 and the like mounted on the body portion 2a.

Then, as shown in FIG. 7(e), the cap 3 is overlapped onto the casing 2 and the cap 3 is fixed to the casing 2 using the bonding material. A thermosetting resin is used as the bonding material. By applying the thermosetting treatment to the thermosetting resin, the bonding material which bonds the casing 2 and the cap 3 is hardened and, at the same time, the above-mentioned UV curing/thermosetting resin is also hardened (second hardening treatment). In this manner, the optical communication module 1 for transmission is manufactured. Further, by performing the second hardening treatment, the invasion of water or the invasion of foreign materials into the inside of the package 4 can be prevented.

Figure 8:
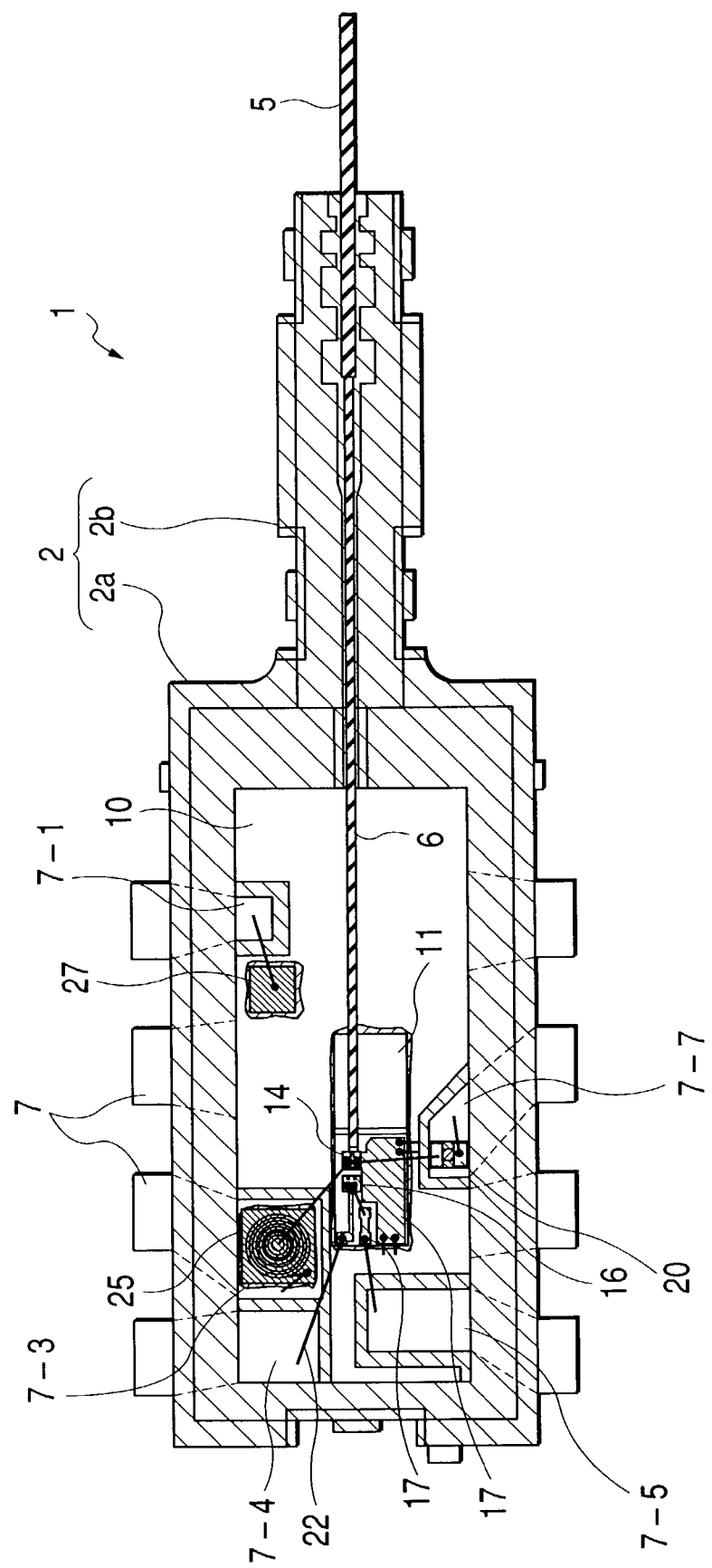
FIG. 8 is a plan view showing an inner structure of an optical communication module for transmission according to a modification 1 of the embodiment 1 of the present invention.
Figure 9:
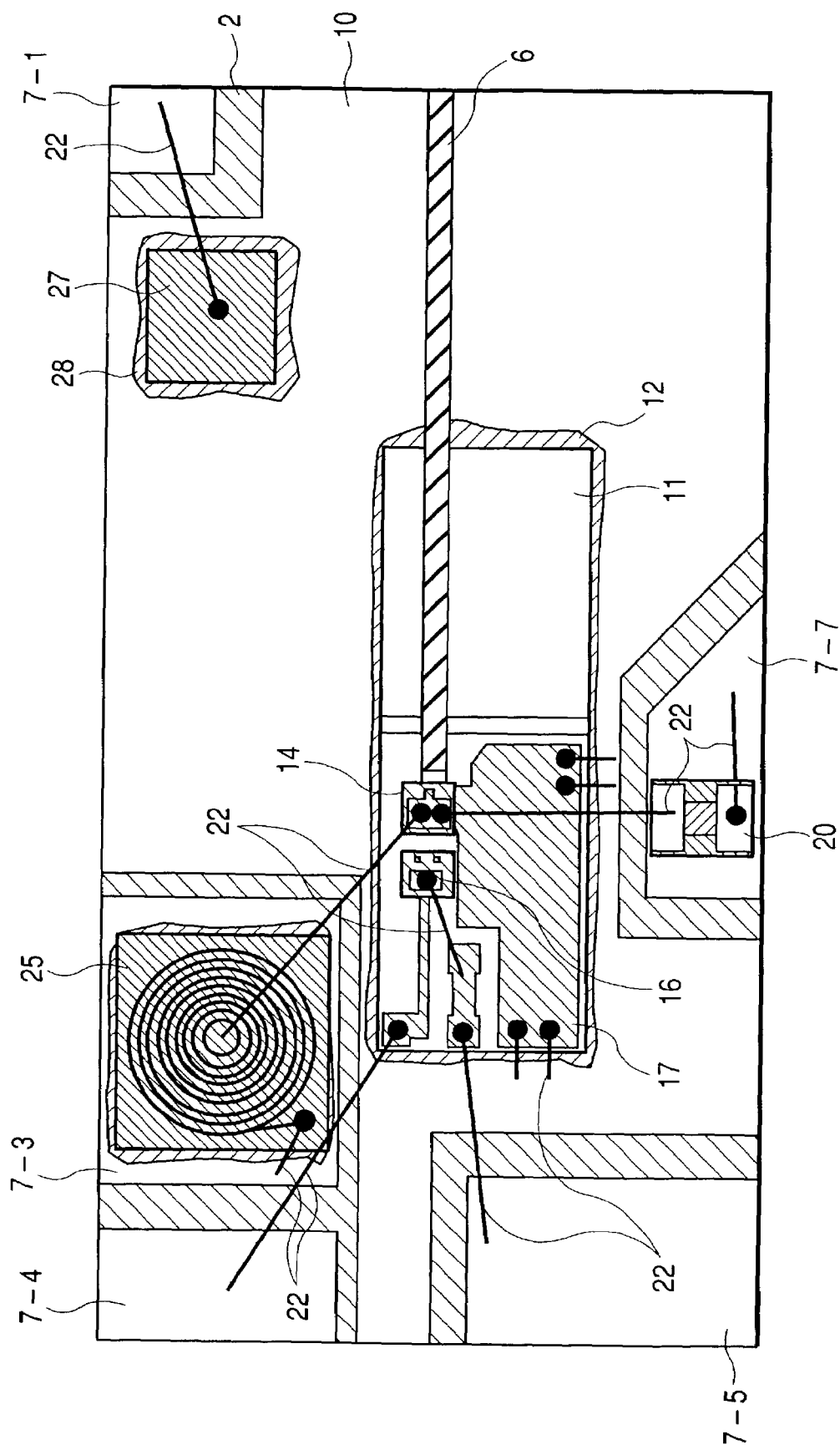
FIG. 9 is an enlarged plan view showing an arrangement of parts of the optical communication module for transmission according to the modification 1.

FIG. 8 and FIG. 9 are views related to an optical communication module for transmission which constitutes a modification 1 of the embodiment 1 of the present invention. FIG. 8 is a plan view showing an inner structure of the optical communication module for transmission and FIG. 9 is an enlarged plan view showing the arrangement of parts.

With respect to this modification 1, in the optical communication module 1 for transmission of the embodiment 1, the chip resistance 20 is fixed to the lead 7-7. Further, one electrode formed on the upper surface of the chip resistance 20 and the lead 7-7 are connected to each other by way of a wire 22, while the other electrode formed on the upper surface of the chip resistance 20 and the upper electrode of the semiconductor laser element 14 are connected to each other by way of a wire 22.

In this manner, it is possible to mount the electronic parts on the lead portion which extends in the periphery of the lead base 10.

Figure 10:
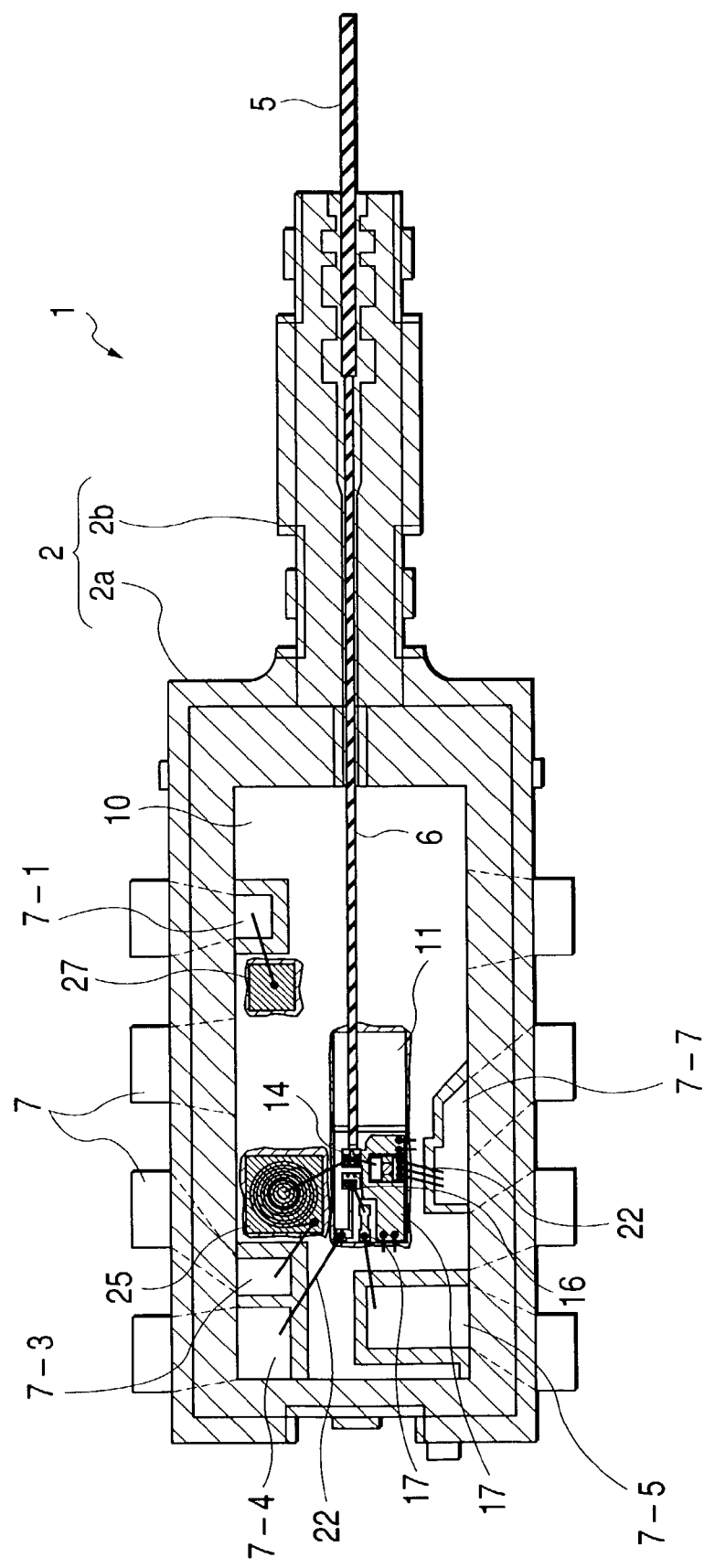
FIG. 10 is a plan view showing an inner structure of an optical communication module for transmission according to a modification 2 of the embodiment 1 of the present invention.
Figure 11:
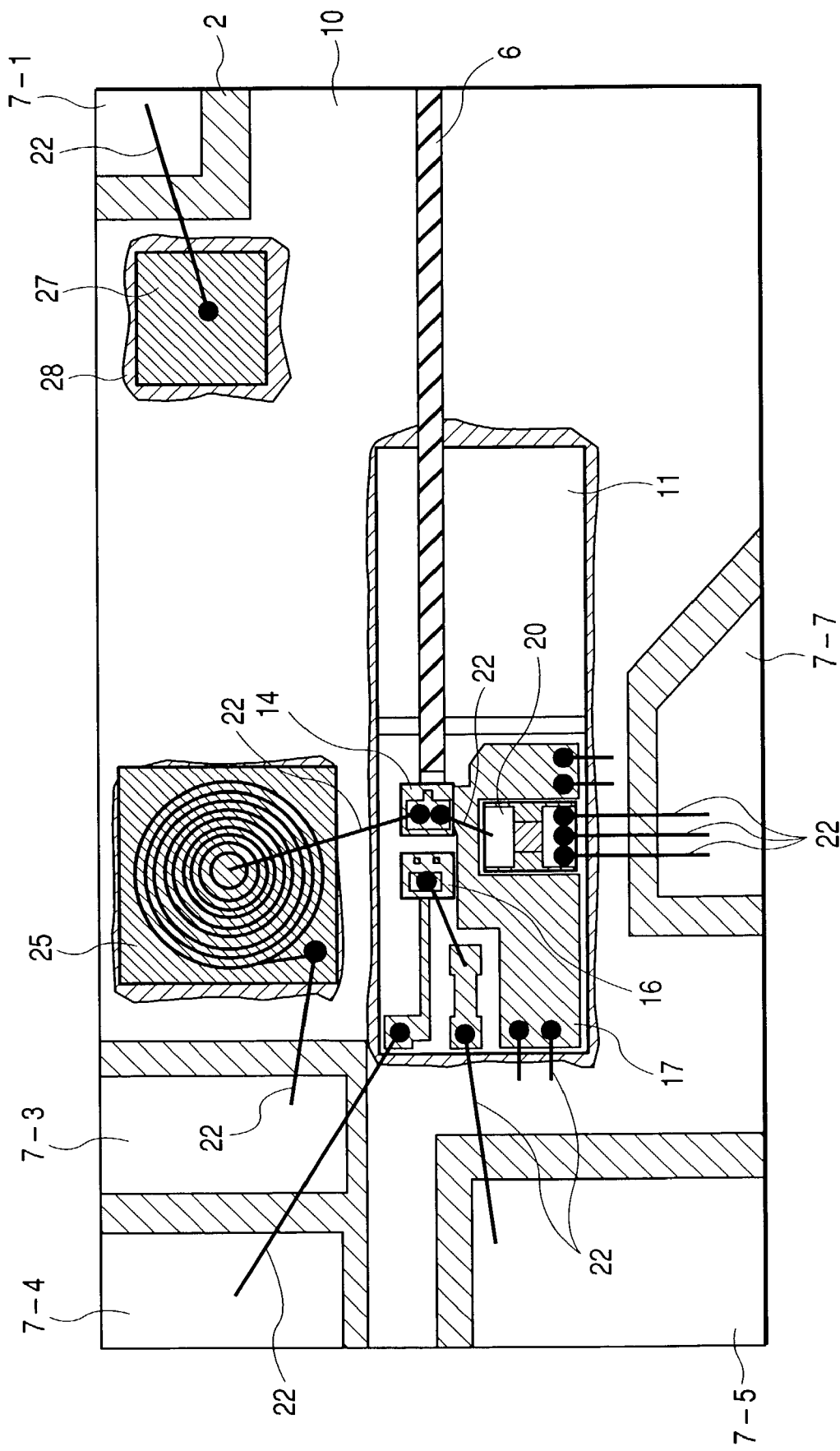
FIG. 11 is an enlarged plan view showing an arrangement of parts of the optical communication module for transmission according to the modification 2.
Figure 12:
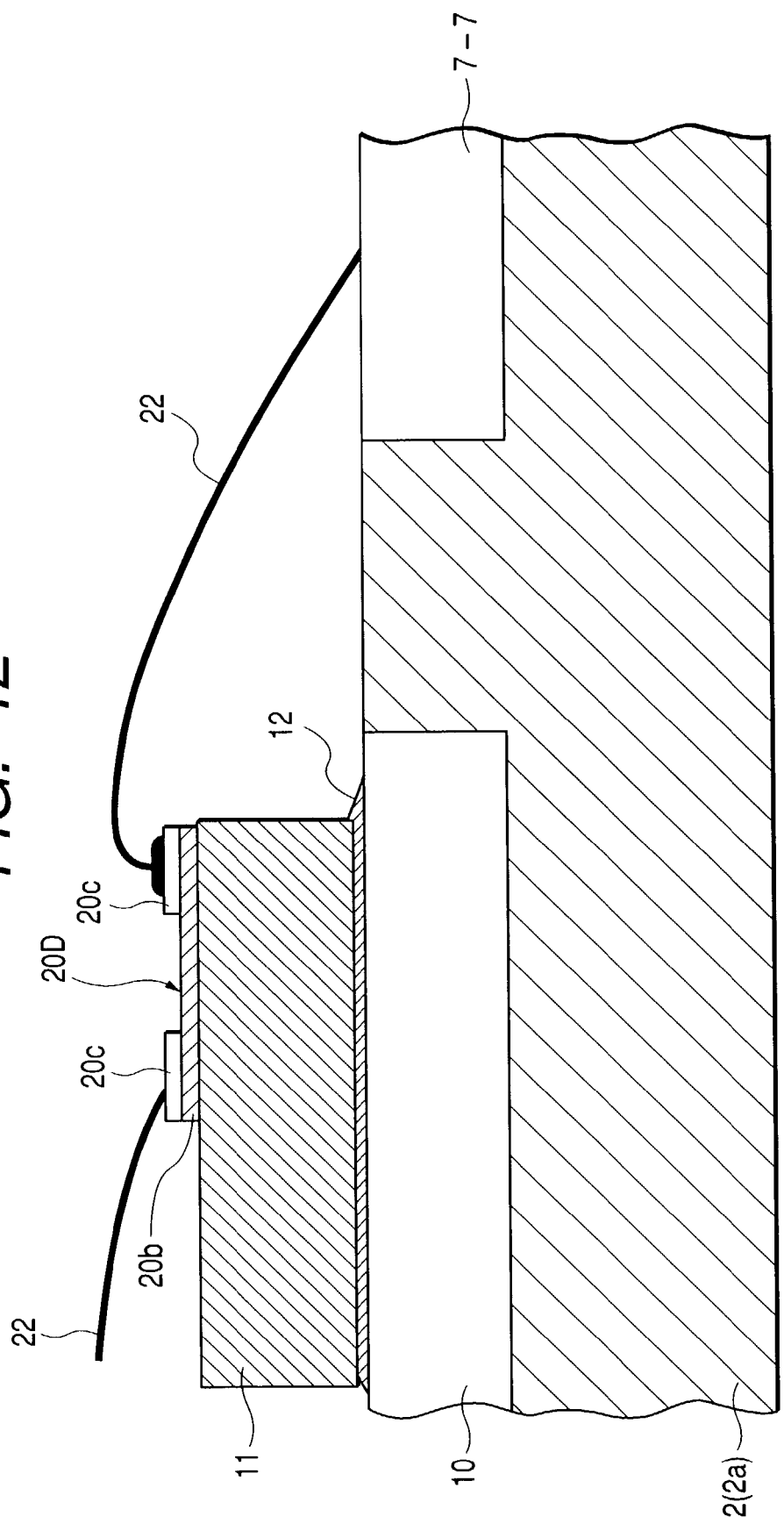
FIG. 12 is a schematic cross-sectional view showing a state in which a chip resistance is mounted in the optical communication module for transmission according to the modification 2.

FIG. 10 to FIG. 12 are views related to an optical communication module for transmission which constitutes a modification 2 of the embodiment 1 of the present invention. FIG. 10 is a plan view showing an inner structure of the optical communication module for transmission, FIG. 11 is an enlarged plan view showing the arrangement of parts, and FIG. 12 is a schematic cross-sectional view showing a state in which the chip resistance is mounted.

With respect to this modification 2, in the optical communication module 1 for transmission of the embodiment 1, a resistance layer 20b is formed on the insulating support substrate 11 and electrodes 20c which are formed on both ends of the resistance layer 20b and conductive portions at given places are electrically connected to each other using wires 22. That is, the one electrode 22c formed on the upper surface of a resistance 20D and the lead 7-7 are connected to each other by way of the wire 22 and the other electrode 22c formed on the upper surface of the resistance 20D and the upper electrode of the semiconductor laser element 14 are connected to each other by way of the wire 22.

In this manner, the resistance 20D can be formed on the support substrate 11 and hence, a distance between the resistance 20D and the semiconductor laser element 14 can be made short. Accordingly, it is possible to connect the upper electrode of the semiconductor laser element 14 and the electrode of the resistance 20D using the short wire 22 so that the resistance value of the wire 22 can be reduced. In this manner, due to the reduction of the resistance value, the high frequency modulation characteristics can be improved in the transmission at a bit rate of not less than 2.5 Gb/s.

Further, the resistance 20D can be directly formed on the support substrate 11 by a printing method and hence, the height of the resistance 20D can be lowered.

Here, it is also possible to mount the chip resistance on an upper surface of the support substrate 11 in a state that the chip resistance is mounted in an electrically independent manner. This structure also contributes to the improvement of the high frequency modulation characteristics.

According to this embodiment 1, following advantageous effects can be obtained.

(1) Although the passive elements such as the chip resistance 20, the chip inductor 25 and the thermistor 27 and the like are fixed to the lead portions, the upper electrodes of the passive parts are connected to the conductive portions such as other lead portions, the electrodes or the lines using the flexible wires 22. Accordingly, even when the difference between the thermal coefficient of the metal which constitutes the leads 7 and the lead base 10 and the thermal coefficient of the plastic which constitutes the package is large, it is possible to eliminate the peeling-off of the electronic parts such as the passive parts at the bonding portions thereof which may be caused by an ambient stress such as a temperature cycle and hence, the reliability of the optical communication module 1 for transmission is enhanced.

(2) While the optical element is substantially mounted on the support substrate 11 which is formed of the expensive silicon substrate, the electronic parts such as the passive parts are mounted on the lead portions in the inside of the package and hence, the support substrate 11 can be miniaturized whereby the manufacturing cost of the optical communication module 1 for transmission can be reduced.

(3) The support substrate 11 and the electronic parts are configured to be fixed using the bonding materials which are formed of same material and hence, the automation of mounting of parts can be realized whereby the manufacturing cost of the optical communication module 1 for transmission can be reduced. That is, mounting of parts is comprised of two steps consisting of the step in which the semiconductor laser element 14 and the light receiving element 16 are mounted on the main surface of the support substrate 11 using the AuSn solder and the step in which the support substrate 11, the chip resistance 20, the chip inductor 25, the thermistor 27 are mounted on the body portion 2a of the casing 2 using the silver paste material, and the same material is used as the bonding material used in each step. Accordingly, the automation of the mounting of parts can be realized so that the manufacturing cost of the optical communication module 1 for transmission can be reduced.

(4) The package is formed of the plastic package (fully aromatic polyester) and hence, the manufacturing cost of the optical communication module 1 for transmission can be reduced.

(5) In the structure in which the resistance 20D is formed on the support substrate 11, the distance between the resistance 20D and the semiconductor laser element 14 can be made short. Accordingly, the wire 22 which connects the upper electrode of the semiconductor laser element 14 and the electrode of the resistance 20D can be made short so that the resistance value of the wire 22 can be reduced whereby the high frequency modulation characteristics can be improved in the transmission at a bit rate of not less than 2.5 Gb/s.

(Embodiment 2)

Figure 13:
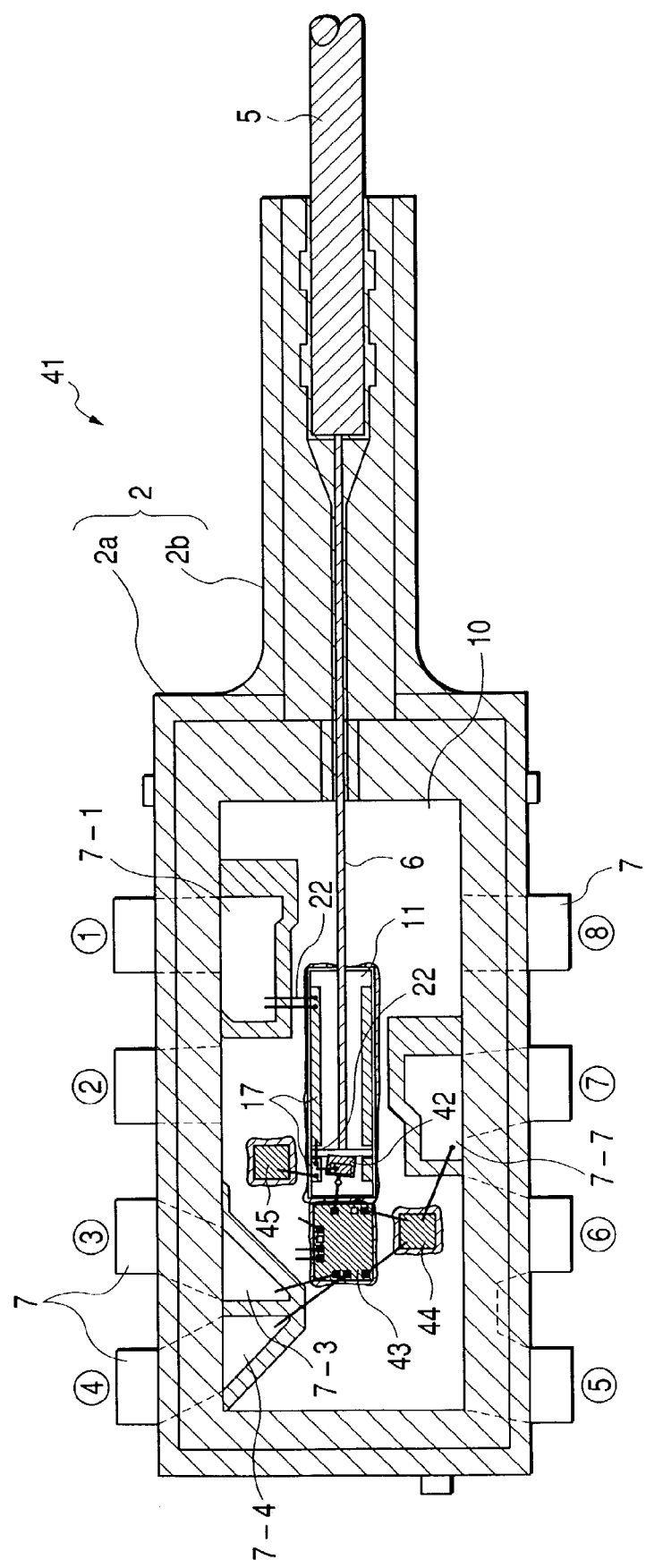
FIG. 13 is a plan view showing an inner structure of an optical communication module for reception according to another embodiment (embodiment 2) of the present invention.
Figure 14:
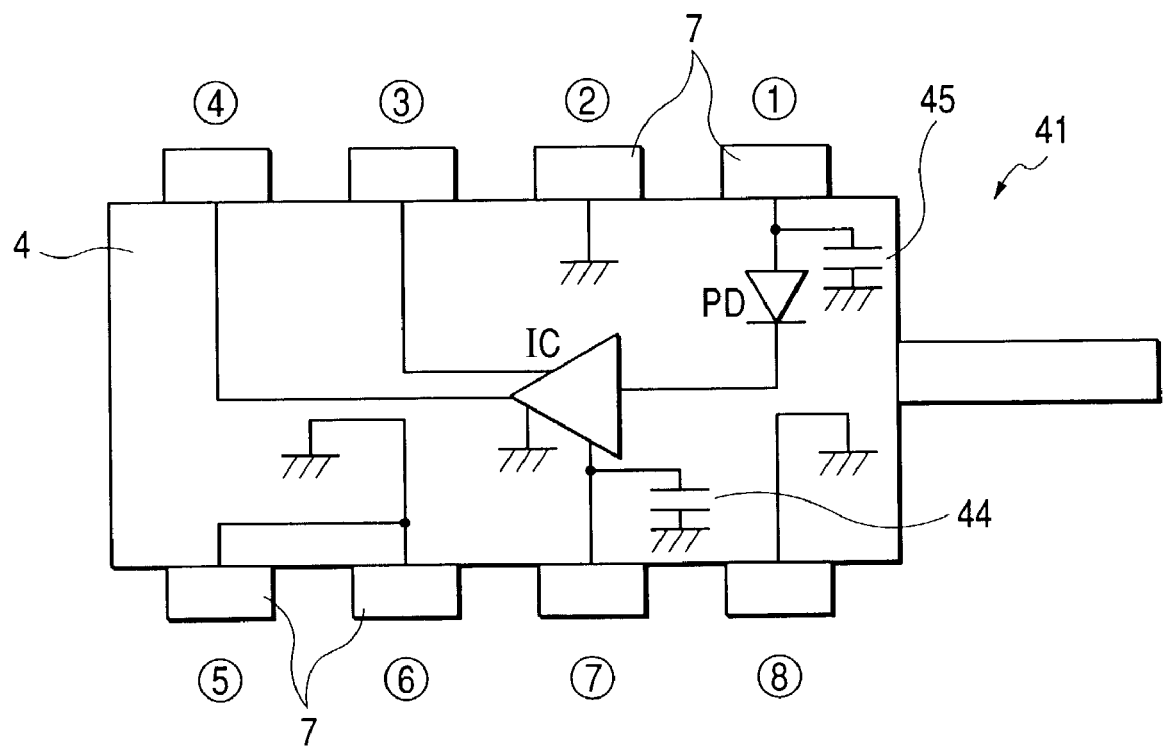
FIG. 14 is a circuit diagram of the optical communication module for reception.

FIG. 13 to FIG. 17 are views showing a plastic package made Mini-DIL type optical communication module for reception of a differential outputting type according to another embodiment (embodiment 2) of the present invention. FIG. 13 is a plan view showing the inner structure of the optical communication module for reception and FIG. 14 is an equivalent circuit diagram of the optical communication module for reception.

In this embodiment 2, an example in which the present invention is applied to the optical communication module for reception adopting a plastic package in the same manner as the embodiment 1 is explained.

With respect to the package of the embodiment 1, this embodiment 2 differs from the embodiment 1 in the shape of the lead base mounted on the inner bottom surface of the casing and the pattern of the lead portions which are extended in the periphery of the lead base. Further, the embodiment slightly differs from the embodiment 1 with respect to mounting parts. Further, the leads of this embodiment 2 also adopts the dual-in-line type in which four leads are projected from each side of the package. Accordingly, same numerals are given to parts identical to the parts of the embodiment 1 and the explanation of these parts is omitted.

As shown in FIG. 13 and FIG. 14, the optical communication module 41 for reception of a differential outputting type according to the embodiment 2 incorporates a light receiving element (photo diode) 42, a semiconductor element 43 and two capacitors (plate capacitors) 44, 45 in the inside of a package. The semiconductor element 43 is constituted of an integrated circuit which incorporates an amplifier therein.

"The differential outputting type" is characterized by the constitution which includes circuits of two systems which are arranged in parallel as pre-amplifiers, wherein a phase of the other signal amplifying circuit is inverted with respect to a phase of one signal amplifying circuit so that an amplifying processing is performed at an inverted phase. Due to such a constitution, it is possible to have an advantageous effect that noise components of the same phase which are present in both amplifying circuits can be reduced.

The optical communication module 41 for reception includes, as shown in FIG. 13 and FIG. 14, eight leads (1) to (8). The lead (1) constitutes an anode terminal of a photo diode, the lead (3) constitutes a Vout (−) terminal, the lead (4) constitutes a Vout (+) terminal, the lead (7) constitutes a Vcc terminal, the leads (2), (5), (6), (8) constitute GND terminals. Accordingly, in the periphery of a lead base 10 which is arranged on an inner bottom surface of a body portion 2a of a casing 2, the leads 7-1, 7-3, 7-4, 7-7 are positioned.

On a support substrate 11 which is fixed onto a main surface of the lead base 10 using a silver paste material, different from the embodiment 1, only the light receiving element (photo diode) 42 is mounted and the light receiving element 42 is configured to receive light transmitted through an optical fiber 6. On the main surface of the lead base 10, a semiconductor element 43 and plate capacitors 44, 45 are mounted. Then, respective conductive portions such as electrodes of respective parts, lines 17 on the main surface of the support substrate 11 and lead portions and the like are electrically connected to each other using wires 22.

Figure 15:
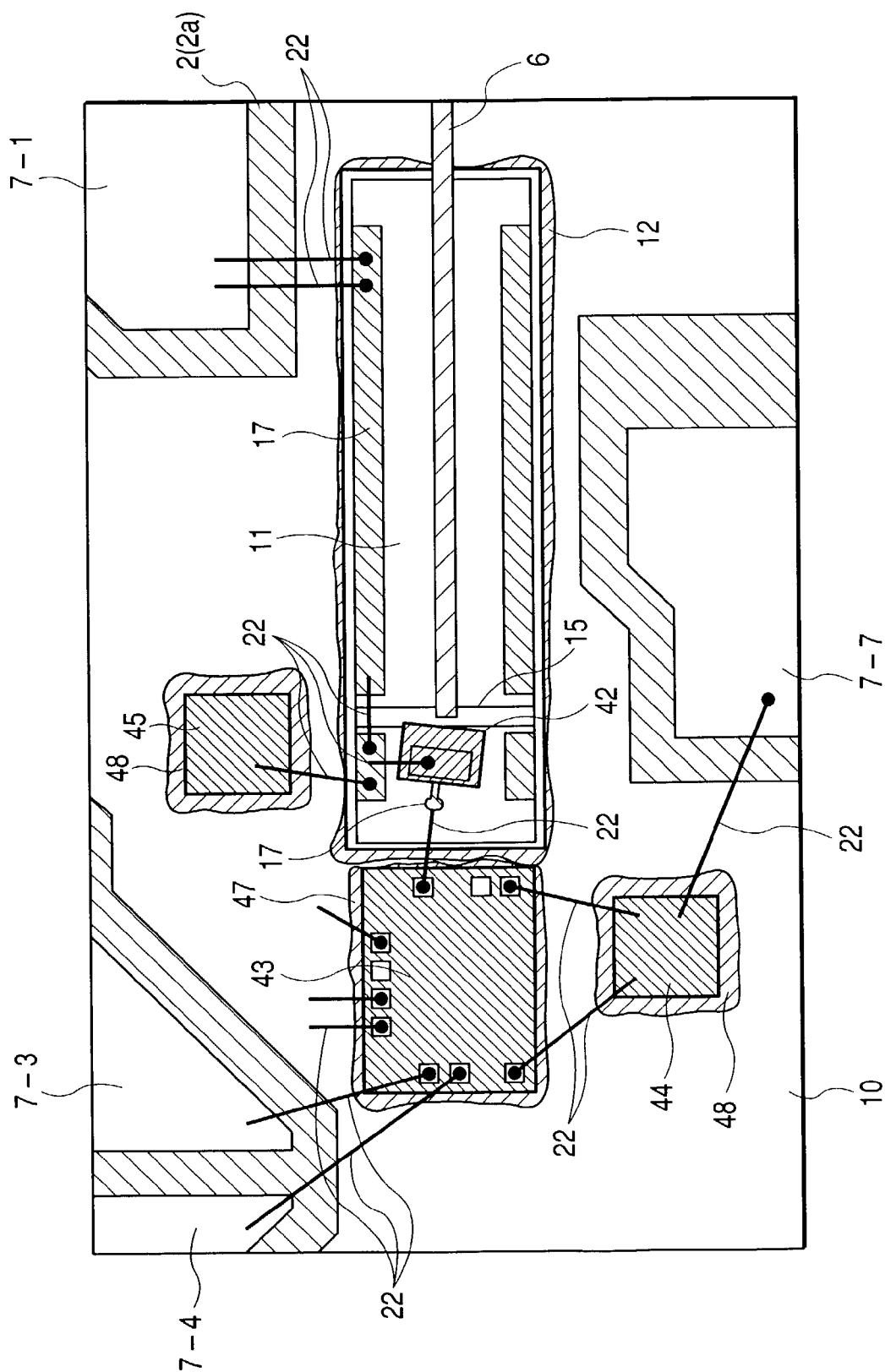
FIG. 15 is an enlarged plan view showing an arrangement of parts of the optical communication module for reception.

FIG. 15 shows respective parts formed on the inner bottom surface of the body portion 2a of the casing 2. The inner bottom surface is shown in a rectangular shape in a state that both sides thereof are partially omitted. In FIG. 15, an inner end portion (lead 7-1) of the lead (1) is positioned at a right upper corner of a rectangular shape, an inner end portion (lead 7-3) of the lead (3) and an inner end portion (lead 7-4) of the lead (4) are positioned at a left upper corner of the rectangular shape, and an inner end portion (lead 7-7) of the lead (7) is positioned at a lower center portion of the rectangular shape. Since it is necessary to make respective leads 7-1, 7-3, 7-4, 7-7 electrically independent from each other, the lead base 10 is formed in a pattern which defines a given distance among respective leads 7-1, 7-3, 7-4, 7-7 and extends broadly on an inner bottom surface.

Since the support substrate 11 mounts only the light receiving element 42 thereon, a discharge groove 15 which is formed in the support substrate 11 differs from the discharge groove 15 formed in the embodiment 1 and is offset to the left side. The light receiving element 42 is mounted on the support substrate 11 along the extension of a distal end of the optical fiber 6 and, at the same time, receives light irradiated from a distal end of the optical fiber 6.

A semiconductor element 43 is fixed to the left side of the support substrate 11 using a bonding material 47. A silver paste material (subjected to hardening treatment at a temperature of 140 degree centigrade for 30 minutes) is used as the bonding material 47. The semiconductor element 43 constitutes an integrated circuit which incorporates an amplifier therein and includes a plurality of electrodes on an upper surface thereof.

Figure 16:
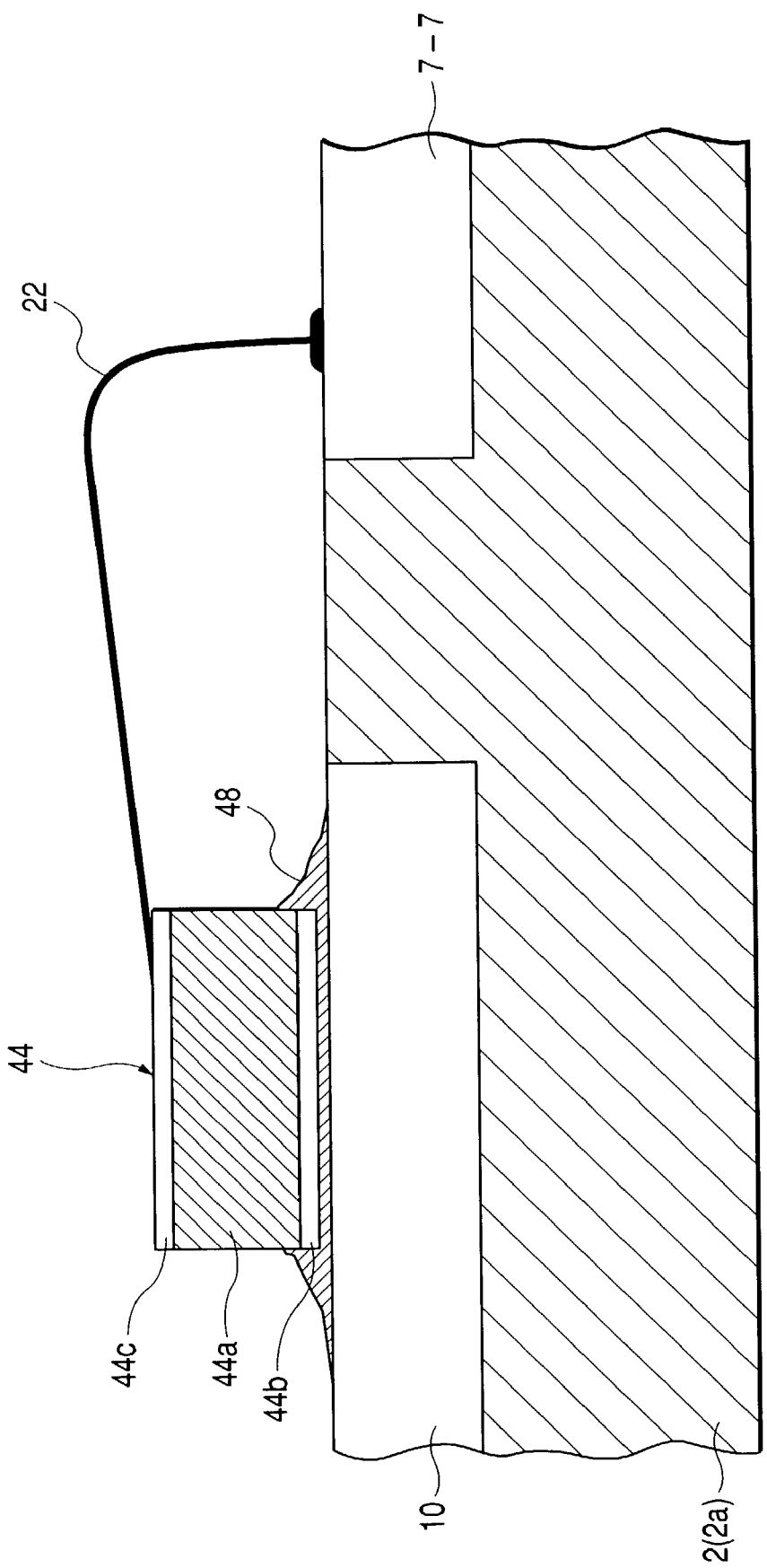
FIG. 16 is a schematic cross-sectional view showing a state in which a plate capacitor is mounted in the optical communication module for reception.
Figure 17:
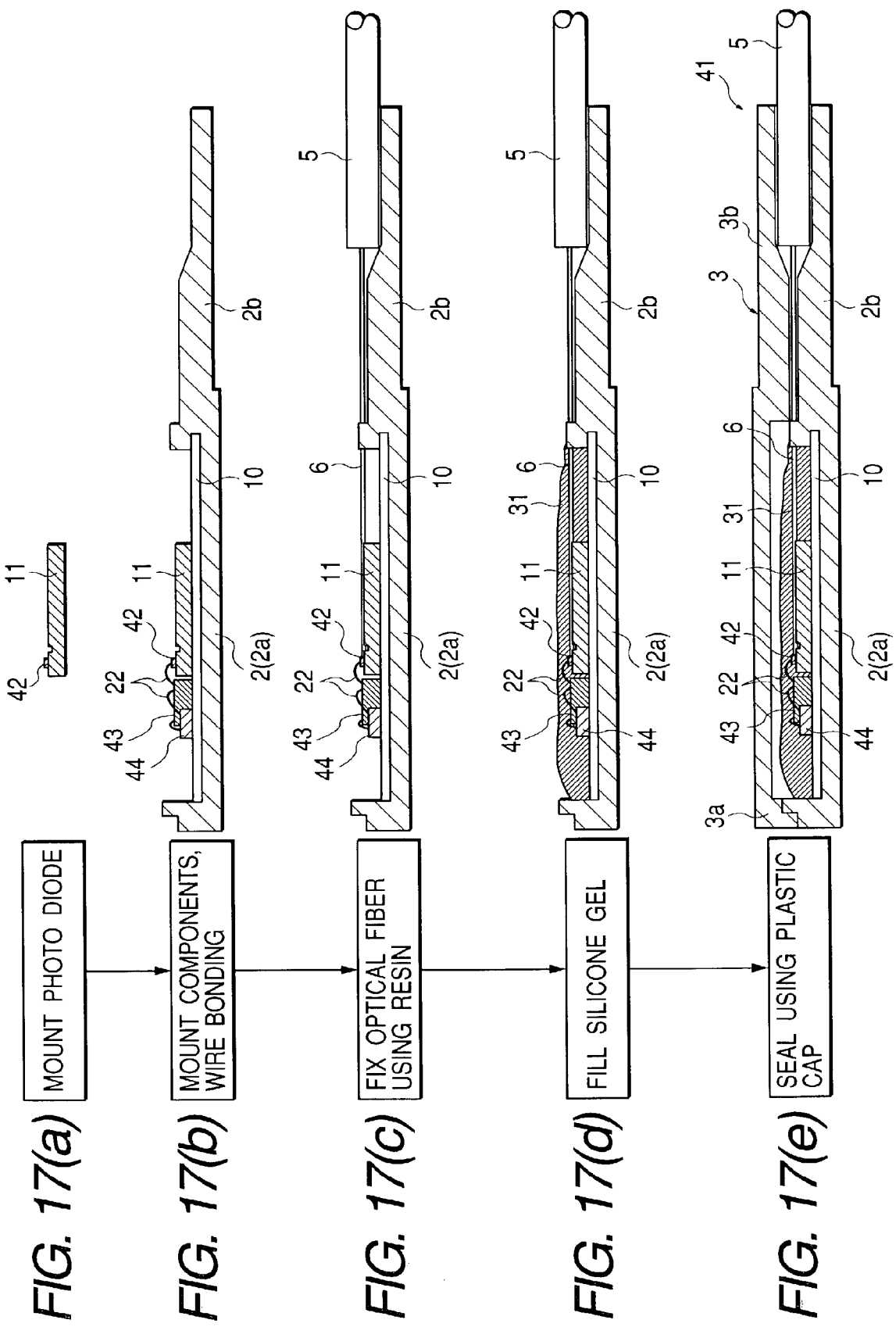
FIGS. 17(a) to 17(e) are flow charts showing schematic respective steps of a method for manufacturing the optical communication module for reception.
Figure 18:
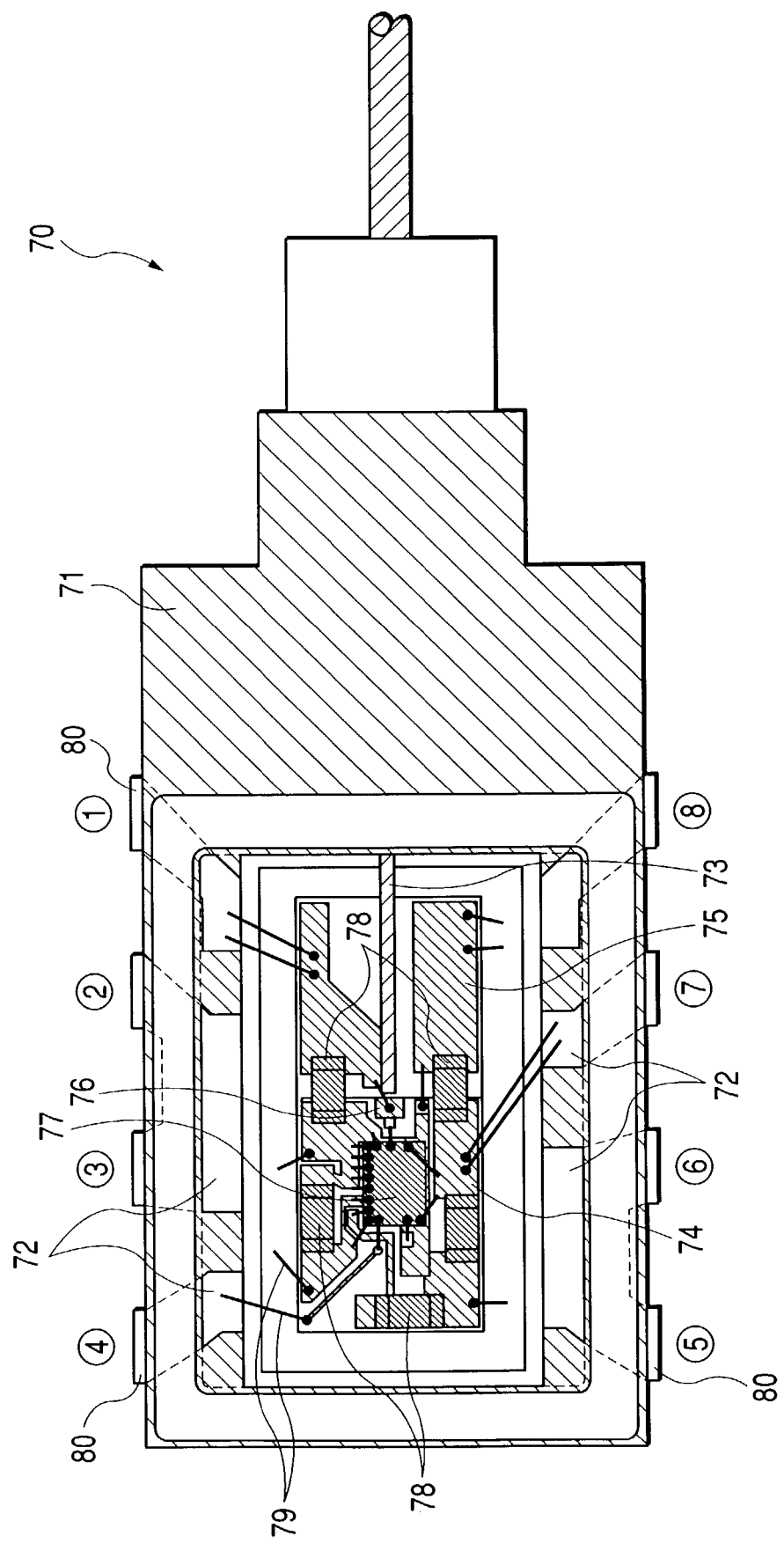
FIG. 18 is a schematic plan view showing an inner structure of an optical communication module for reception having a ceramic package structure which was reviewed prior to the present invention.
Figure 19:
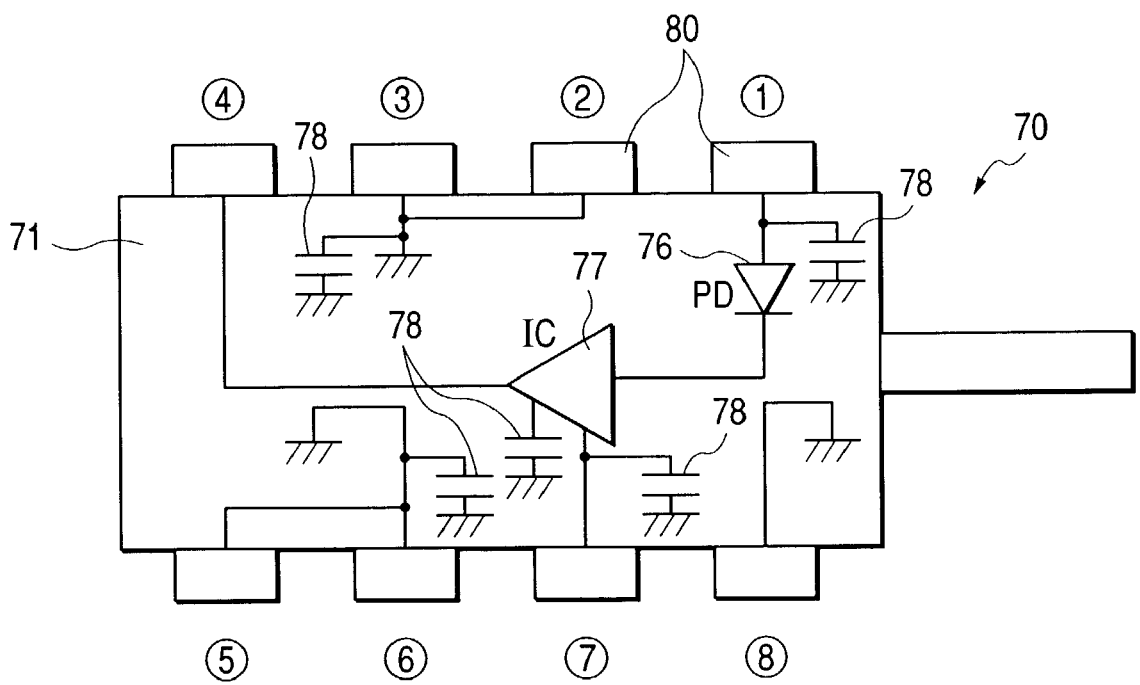
FIG. 19 is a circuit diagram of the optical communication module shown in FIG. 18.
Figure 20:
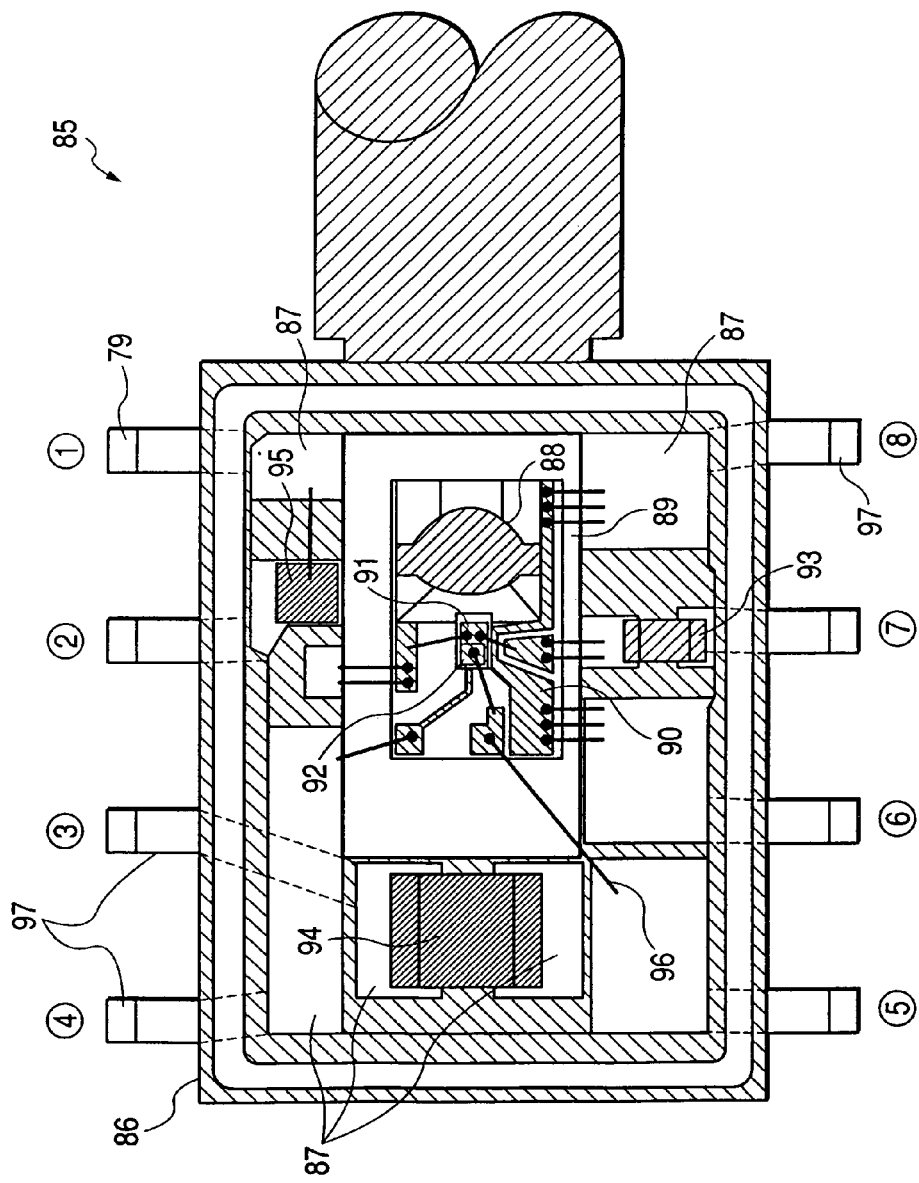
FIG. 20 is a plan view showing an inner structure of an optical communication module for transmission having a ceramic package structure which was reviewed prior to the present invention.
Figure 21:
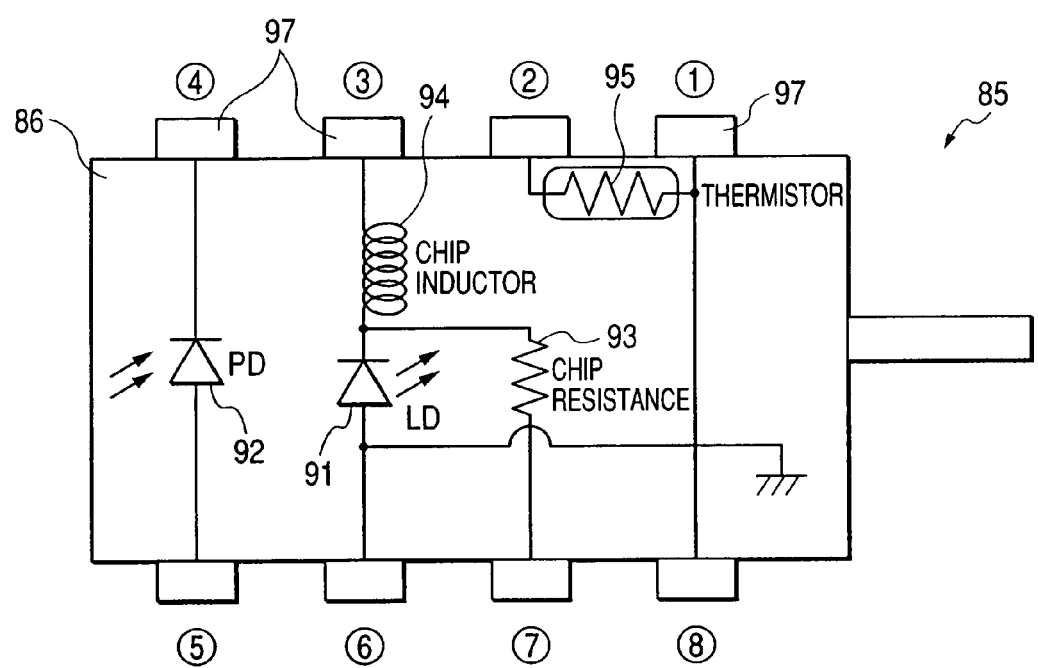
FIG. 21 is a circuit diagram of the optical communication module shown in FIG. 20.
Figure 22:
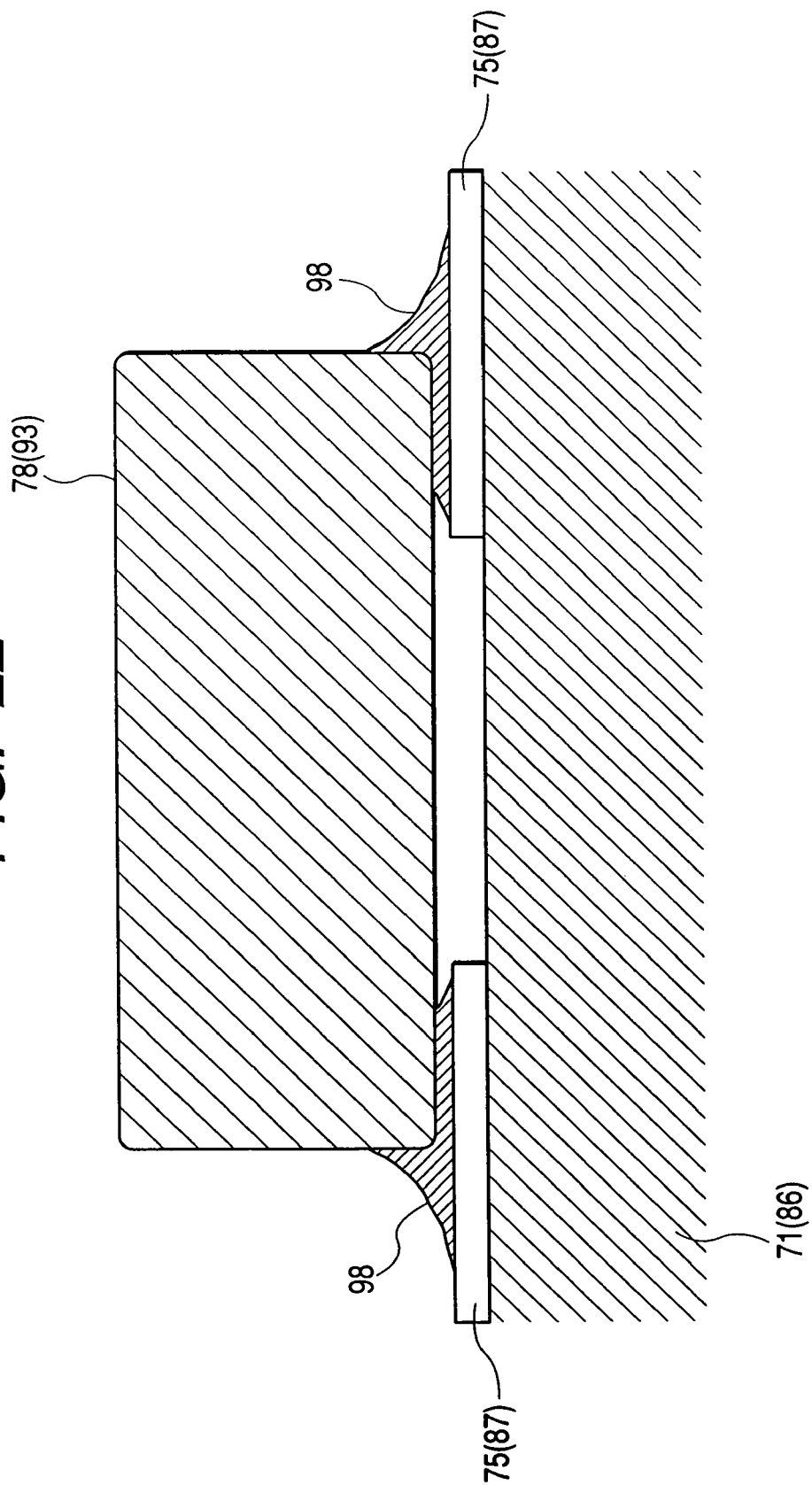
FIG. 22 is a schematic view showing a state in which passive parts are mounted.
Figure 23:
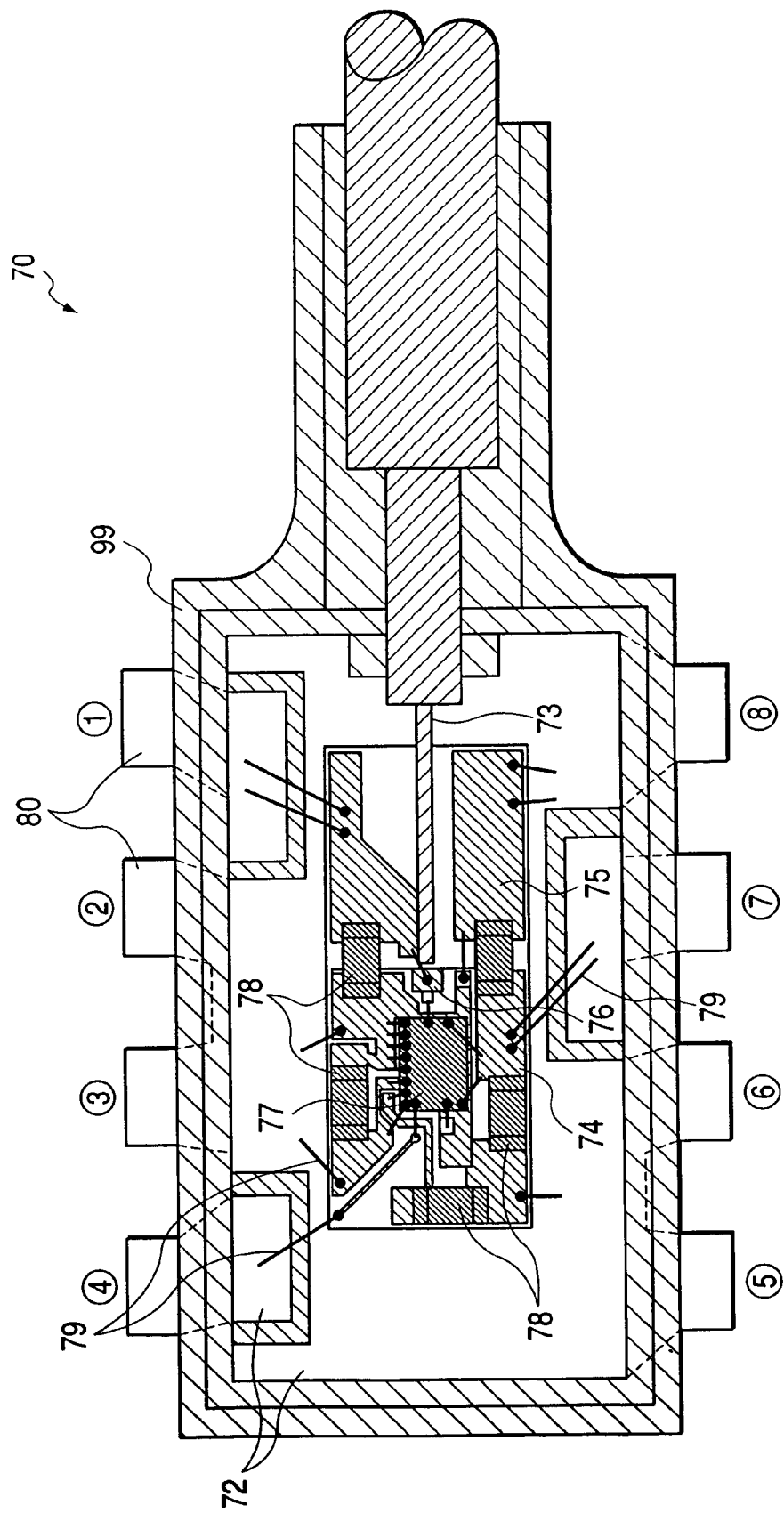
FIG. 23 is a plan view showing an inner structure of an optical communication module for reception having a plastic package structure which was reviewed prior to the present invention.
Figure 24:
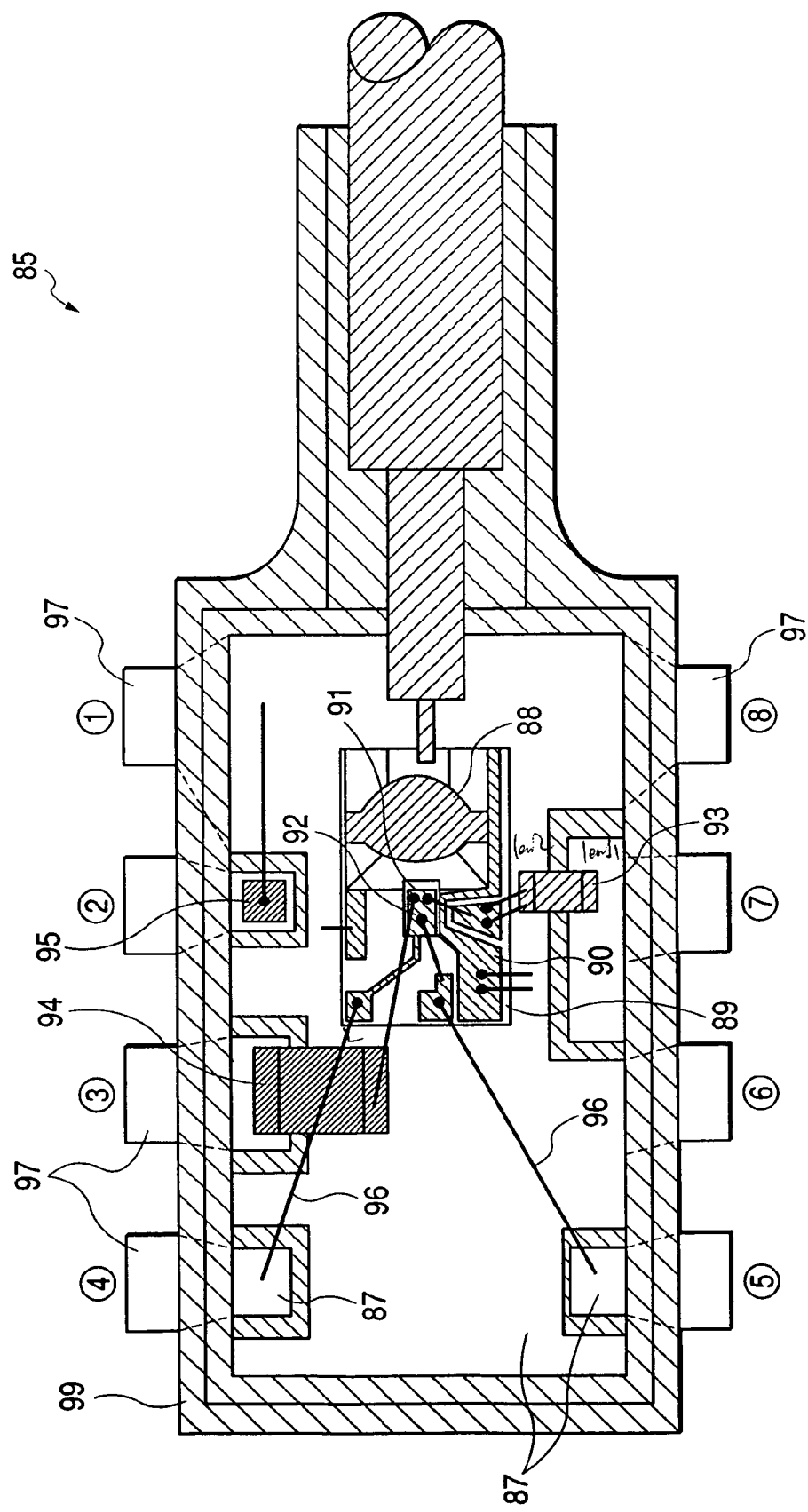
FIG. 24 is a plan view showing an inner structure of an optical communication module for transmission having a plastic package structure which was reviewed prior to the present invention.
Figure 25:
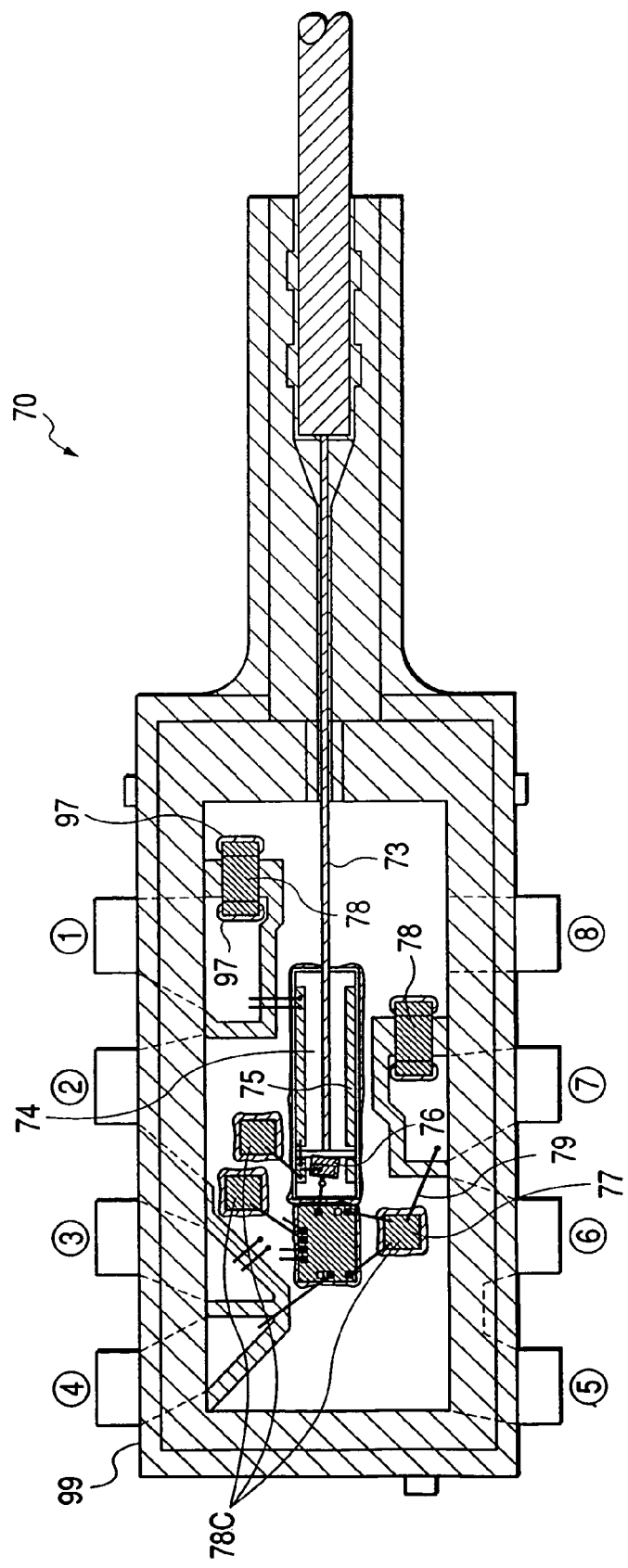
FIG. 25 is a plan view showing an inner structure of an optical communication module for reception having a chip-capacitor-mounted plastic package structure which was reviewed prior to the present invention.

A plate capacitor 44 is fixed to an upper surface of the lead base 10 at a position arranged close to the lead 7-7 as well as close to the semiconductor element 43. As also shown in FIG. 16, the plate capacitor 44 has a structure in which electrodes 44b, 44c are respectively formed on upper and lower surfaces of a dielectric body 44a. The plate capacitor 44 has the lower electrode 44b electrically connected to the lead base 10 using a bonding material 48. The bonding material 48 is made of a silver paste material (subjected to hardening treatment at a temperature of 140 degree centigrade for 30 minutes). Further, the electrode 44c formed on the upper surface of the plate capacitor 44 is electrically connected to the lead 7-7 using a conductive wire 22.

On a main surface of a portion of the lead base 10 which is positioned between the lead 7-1 and the lead 7-3, a plate capacitor 45 is formed and the plate capacitor 45 has the same structure as the plate capacitor 44. Accordingly, the plate capacitor 45 adopts the same mounting structure as the plate capacitor 44 such that a lower electrode of the plate capacitor 45 is fixed to the lead base 10 using a bonding material 48.

While the light receiving element 42 is mounted on the main surface of the support substrate 11, an electrode which is formed on a lower surface of the light receiving element 42 is electrically connected to the electrode of the semiconductor element 43 using a line 17 which is formed on the main surface of the support substrate 11 and a wire 22 which is connected to the line 17. An electrode which is formed on an upper surface of the light receiving element 42 is electrically connected to other line 17 formed on the support substrate 11 by way of a wire 22 and is further electrically connected to an electrode formed on an upper surface of the plate capacitor 45 by way of the wire 22 which is connected to the line 17. Further, an electrode formed on the upper surface of the light receiving element 42 is electrically connected to a line 17 provided at a left side of a discharge groove 15 by way of a wire 22 and is fixed to the line 17 provided at the left side of the discharge groove 15 by way of the wire 22. Further, the line 17 which is provided at the left side of the discharge groove 15 is electrically connected to the lead 7-1 by way of the wire 22.

An electrode formed on the upper surface of the plate capacitor 44 is electrically connected to two electrodes of the semiconductor element 43 respectively by way of wires 22 and is also electrically connected to the lead 7-7.

Some of electrodes formed on an upper surface of the semiconductor element 43 are electrically connected to the lead base 10 by way of wires 22, one electrode formed on the upper surface of the semiconductor element 43 is electrically connected to the lead 7-3 by way of a wire 22, and another one electrode formed on the upper surface of the semiconductor element 43 is electrically connected to the lead 7-4 by way of a wire 22.

An internal circuit similar to the internal circuit shown in FIG. 14 is constituted of such a structure.

Subsequently, a method for manufacturing the optical communication module 41 for reception according to the embodiment 2 is explained in conjunction with FIGS. 17(a) to 17(e). First of all, after preparing the support substrate 11 formed of the silicon substrate as shown in FIG. 17(a), the the light receiving element 42 is positioned on the main surface of the support substrate 11 and is fixed (mounted) to the support substrate 11 using an AuSn solder as the bonding material.

Then, as shown in FIG. 17(b), the parts are mounted on the body portion 2a of the casing 2. On the inner bottom surface of the body portion 2a of the casing 2, the lead base 10, the leads 7-1, 7-3, 7-4, 7-7 are arranged (see FIG. 15). Then, the support substrate 11 on which the light receiving element 42 is mounted, the semiconductor element 43 and the plate capacitors 44, 45 are positioned and mounted at given places. All these parts use the silver paste material as the bonding material. By applying the baking treatment to the silver paste material at a temperature of 140 degree centigrade for 30 minutes, respective parts are simultaneously fixed.

In this manner, the mounting of the optical element to the support substrate 11 and the mounting of respective parts to the casing 2 are performed in two steps and the parts are fixed using the same bonding material in respective steps and hence, the automation of mounting of parts can be realized in the same manner as the embodiment 1 whereby the manufacturing cost can be reduced.

Further, after mounting the parts, as shown in FIG. 17(b), given portions of the parts are connected using the conductive wires 22 (see FIG. 15). That is, the conductive portions such as the electrodes, the lines, the lead portions (including the lead base) and the like are connected to each other using the conductive wires 22.

Subsequently, as shown in FIG. 17(c), the optical fiber 6 is fixed using the resin. That is, the optical fiber cable 5 which forms the optical fiber 6 at the distal end side thereof is prepared. The optical fiber cable 5 is overlapped to the groove formed on the guide portion 2b of the casing 2, while the distal end portion of the optical fiber 6 is overlapped to the inside of the groove 13 having a V cross section formed in the support substrate 11 (see FIG. 15). Thereafter, the distal end of the optical fiber 6 is positioned such that the distal end faces the light receiving face of the light receiving element 42 in an opposed manner.

Thereafter, the optical fiber 6 is fixed to the support substrate 11 using the UV curing/thermosetting resin in the same manner as the embodiment 1 and, at the same time, the optical fiber 6 and the optical fiber cable 5 at the guide portion 2b are fixed to the guide portion 2b using the UV curing/thermosetting resin (first hardening treatment).

Subsequently, as shown in FIG. 17(d), the silicone gel for forming the protective film 31 is supplied to the body portion 2a of the casing 2. The supply of the silicone gel is performed to an extent that the silicone gel does not flow out from the body portion 2a. The silicone gel completely covers respective parts, the wires 22 and the like mounted on the body portion 2a.

Then, as shown in FIG. 17(e), the cap 3 is overlapped onto the casing 2 and the cap 3 is fixed to the casing 2 using the bonding material. A thermosetting resin is used as the bonding material. By applying the thermosetting treatment to the thermosetting resin, the bonding material which bonds the casing 2 and the cap 3 is hardened and, at the same time, the above-mentioned UV curing/thermosetting resin is also hardened (second hardening treatment). In this manner, the optical communication module 41 for reception is manufactured.

According to this embodiment 2, following advantageous effects can be obtained.

(1) In the same manner as the above-mentioned embodiment 1, it is possible to eliminate the peeling-off of the electronic parts at the bonding portions thereof and hence, it is possible to provide the highly reliable optical communication module 41 for reception.

(2) The support substrate 11 which is formed of the silicon substrate can be miniaturized and hence, the manufacturing cost of the optical communication module 41 for reception can be reduced.

(3) The support substrate and the electronic parts are fixed using the bonding materials formed of same material and hence, the automation of mounting of parts can be realized whereby the manufacturing cost of the optical communication module 41 for reception can be reduced.

(4) The package is formed of the plastic package (fully aromatic polyester) and hence, the manufacturing cost of the optical communication module 41 for reception can be reduced.

(5) It is possible to provide the optical communication module 41 for reception of differential outputting type which exhibits the favorable reception sensitivity.

Although the inventions which are made by the inventors of the present application have been explained specifically heretofore in conjunction with the embodiments, it is needless to say that the present inventions are not limited to these embodiments and various modifications can be made without departing from the gist of the present invention.

To briefly recapitulate the advantageous effects obtained by typical inventions among the inventions disclosed in this application, they are as follows.

(1) it is possible to provide the optical electronic device (optical communication module) having the plastic package structure which exhibits the high reliability in mounting of electronic parts.

(2) it is possible to provide the optical electronic device (optical communication module) having the plastic package structure which can minimize the occurrence of cracks in electrode bonding portions of passive parts such as the chip resistance, the chip capacitor, the chip inductor and the like.

(3) it is possible to provide the optical electronic device (optical communication module) having an inexpensive plastic package structure

What is claimed is:

1. An optical electronic device comprising:
a package casing made of plastic;
a cap which seals the package casing;
a plurality of metal-made leads which extend between the inside and the outside of the package casing, the leads forming electrode terminals at external portions thereof,
a lead base which is arranged over an inner bottom of the package casing, the lead base integrally formed with at least one of the plurality of leads;
an insulating support substrate which is fixedly mounted with a bonding material onto the lead base and includes a conductive layer of a given pattern over an upper surface thereof;
an optical element which is fixedly mounted with a bonding material onto the support substrate;
an optical fiber which extends between the inside and the outside of the package casing, the optical fiber having an inner end thereof to face the optical element, the optical fiber fixed onto the support substrate such that the transmission and the reception of light are performed between the optical element and the optical fiber;
one or a plurality of electronic parts each fixedly mounted with a bonding material on a bonding surface thereof onto the leads or the lead base in the inside of the package casing and positioned to avoid crossing over said given pattern of the conductor layer; and
conductive wires which electrically connect electrodes of the optical element, electrodes of the electronic parts, the conductive layer of the support substrate and the leads to each other when necessary,
wherein each of the electronic parts includes at least one upper electrode on a upper surface thereof which is opposite to said bonding surface, and the upper electrode is connected to other given portions via the conductive wires bent across a portion of the package casing or a portion of said bonding material.

2. An optical electronic device according to claim 1, wherein each of the electronic parts is not fixed to a plurality of conductive portions, which are electrically independent from each other, but is fixed to only one of the conductive portions.

3. An optical electronic device according to claim 1, wherein at least one electronic part other than the electronic parts is fixedly mounted with a bonding material onto the support substrate and an upper electrode of said at least one electronic part is connected to one other conductive portion by way of a conductive wire.

4. An optical electronic device according to claim 1, wherein the electronic parts are not mounted over the support substrate.

5. An optical electronic device according to claim 1, wherein each of the electronic parts and the support substrate are electrically connected to each other by the conductive wires.

6. An optical electronic device according to claim 1, wherein a semiconductor element which forms an electrode over an upper surface thereof is mounted onto the support substrate and the electrode formed over the upper surface of the semiconductor element is connected to a conductive portion by way of a conductive wire.

7. An optical electronic device according to claim 1, wherein the electronic parts include a chip resistance having two upper electrodes differing in polarity from each other over an upper surface thereof.

8. An optical electronic device according to claim 1, wherein the electronic parts include a chip inductor having two upper electrodes differing in polarity from each other over an upper surface thereof.

9. An optical electronic device according to claim 1, wherein the electronic parts include a thermistor having two electrodes differing in polarity from each other over an upper surface and a lower surface thereof respectively.

10. An optical electronic device according to claim 1, wherein the package casing is formed of fully aromatic polyester, and the leads are formed of an iron-nickel based alloy.

11. An optical electronic device according to claim 1, wherein the bonding material is a silver paste material.

12. An optical electronic device according to claim 1, wherein a groove, which extends toward a portion where the optical element is fixedly mounted, is formed in an upper surface of the support substrate, the optical fiber is fitted into the groove, and the optical fiber is fixedly mounted to the support substrate by a bonding material.

13. An optical electronic device according to claim 1, wherein the optical element, the electronic parts, the conductive wires in the inside of the package casing are covered and protected by a transparent protective layer.

14. An optical electronic device according to claim 13, wherein the protective layer is formed of any one of silicone gel, silicone rubber, low-stress epoxy resin, acrylic resin and urethane resin.

15. An optical electronic device according to claim 1, wherein the support substrate is made of silicon, aluminum nitride or silicon carbide.

16. An optical electronic device according to claim 1, wherein the package casing includes a body portion which houses the optical element, the electronic parts and a guide portion which guides the optical fiber, the cap is made of plastic having a shape corresponding to the body portion and the guide portion, and the package casing and the cap are adhered to each other by a bonding material.

17. An optical electronic device according to claim 1, wherein the optical element is constituted of a semiconductor laser element having at least one laser diode and is configured to transmit laser beams irradiated from the semiconductor laser element to the optical fiber.

18. An optical electronic device according to claim 17, wherein the electronic parts include a light receiving element, which receives laser beams irradiated from the laser diode, is fixed to the support substrate, and an upper electrode of the light receiving element is electrically connected to an upper electrode of another one of the electronic parts, one of the leads, or an electrode formed over the support substrate by way of one of the conductive wires.

19. An optical electronic device according to claim 17, wherein in the inside of the package casing, a light receiving element which receives laser beams irradiated from the laser diode, a thermistor which detects a temperature in the inside of the package casing, and a bias circuit consisting of an inductor which controls a bias point of the laser diode and a resistance are incorporated.

20. An optical electronic device according to claim 1, wherein the optical element is a light receiving element and is configured to receive light transmitted through the optical fiber.

21. An optical electronic device according to claim 20, wherein the electronic parts include a semiconductor element which constitutes a pre-amplifier and a capacitor both of which are incorporated into the inside of the package casing thus forming an optical communication module for reception of a single-phase outputting type or a differential outputting type.

22. An optical electronic device according to claim 1, wherein each of the electronic parts is fixedly mounted to only one of two leads which are arranged in a state that the leads sandwich resin therebetween by way of the bonding material, and an electrode of the electronic part, which is not electrically connected to the lead to which the electronic part is fixedly mounted, is connected to a neighboring lead or other conductive portion, to which the electronic parts are not fixed, by way of a conductive wires having flexibility.

* * * * *